US012684973B2

(12) United States Patent
Ko et al.

(10) Patent No.: US 12,684,973 B2
(45) Date of Patent: Jul. 14, 2026

(54) LIGHT EMITTING DISPLAY DEVICE

(71) Applicant: Samsung Display Co., LTD., Yongin-si (KR)

(72) Inventors: Yoo Min Ko, Yongin-si (KR); Sung Jin Hong, Yongin-si (KR); Ju Chan Park, Yongin-si (KR); Sun Ho Kim, Yongin-si (KR); Hye Won Kim, Yongin-si (KR); Pil Suk Lee, Yongin-si (KR); Chung Sock Choi, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 454 days.

(21) Appl. No.: 18/488,096

(22) Filed: Oct. 17, 2023

(65) Prior Publication Data

US 2024/0147794 A1 May 2, 2024

(30) Foreign Application Priority Data

Oct. 31, 2022 (KR) ........................ 10-2022-0142863

(51) Int. Cl.
*H10K 59/131* (2023.01)
*H10K 50/824* (2023.01)
(Continued)

(52) U.S. Cl.
CPC ......... *H10K 59/131* (2023.02); *H10K 50/824* (2023.02); *H10K 59/121* (2023.02); *H10K 59/123* (2023.02); *H10K 59/30* (2023.02)

(58) Field of Classification Search
CPC .. H10K 59/131; H10K 50/824; H10K 59/121; H10K 59/123; H10K 59/30;
(Continued)

(56) References Cited

U.S. PATENT DOCUMENTS

2015/0162391 A1* 6/2015 Kim ..................... H10K 59/122
257/40
2018/0175009 A1* 6/2018 Kim ..................... H10H 20/819
(Continued)

FOREIGN PATENT DOCUMENTS

CN 112466209 3/2021
KR 10-2089248 3/2020
(Continued)

*Primary Examiner* — Jonathan Han
(74) *Attorney, Agent, or Firm* — Harness, Dickey & Pierce, P.L.C.

(57) ABSTRACT

A light emitting display device includes a first display area; and a second display area disposed adjacent to the first display area, wherein the second display area includes a pixel driving part, a main light-emitting element directly connected to the pixel driving part, and an additional light-emitting element connected to the main light-emitting element, the additional light-emitting element overlaps a peripheral driving part in a plan view, the peripheral driving part generates a signal provided to the pixel driving part, the main light-emitting element and the additional light-emitting element each include a first electrode, an emission layer, and a second electrode, the pixel driving part is electrically connected to the second electrode of the main light-emitting element and the second electrode of the additional light-emitting element, and the second electrode of the additional light-emitting element and the second electrode of the main light-emitting element are separated by a separator.

20 Claims, 15 Drawing Sheets

(51) Int. Cl.
    *H10K 59/121*        (2023.01)
    *H10K 59/123*        (2023.01)
    *H10K 59/30*         (2023.01)

(58) Field of Classification Search
    CPC .............. H10K 59/122; H10K 59/124; H10K
               59/80521; H10K 59/35; H10K 59/1315;
           H10K 50/822; H10K 50/11; H10K 50/81;
                                    H10K 59/65
    See application file for complete search history.

(56)                        References Cited

U.S. PATENT DOCUMENTS

| | | | |
|---|---|---|---|
| 2019/0006442 A1* | 1/2019 | Byun | H10K 59/122 |
| 2019/0207150 A1* | 7/2019 | Kwon | H10K 59/123 |
| 2020/0235172 A1* | 7/2020 | Lee | G06F 3/0443 |
| 2022/0165818 A1 | 5/2022 | Kinjo | |
| 2024/0237421 A9 | 7/2024 | Ko et al. | |

FOREIGN PATENT DOCUMENTS

| | | |
|---|---|---|
| KR | 10-2022-0034952 | 3/2022 |
| KR | 10-2024-0057503 | 5/2024 |

\* cited by examiner

LIGHT EMITTING DISPLAY DEVICE

CROSS-REFERENCE TO RELATED APPLICATION

This application claims priority to and the benefit of Korean Patent Application No. 10-2022-0142863 under 35 U.S.C. § 119, filed in the Korean Intellectual Property Office (KIPO) on Oct. 31, 2022, the entire contents of which are incorporated herein by reference.

BACKGROUND

1. Technical Field

The disclosure relates to a light emitting display device, and more specifically, to a light emitting display device in which a display area is expanded or an area of a non-display area is reduced.

2. Description of the Related Art

The display device may include a display area in which an image is displayed and a non-display area in which an image is not displayed. In the display area, pixels may be disposed in a row direction and a column direction. Within each pixel, various elements such as transistors and capacitors and various wirings that can supply signals to these elements may be positioned. In the non-display area, various peripheral driving parts (a scan signal generator, a data driver, a timing controller, etc.) and wirings that transmit electrical signals to drive these pixels may be positioned.

In addition, some display devices include a camera or a sensor disposed within the display area, and there is a part in which the image is not displayed in some regions of the display area. This display device may have merit of reducing the non-display area, but there is a drawback that the non-display area, in which the image is not displayed, is positioned within the display area.

The above information disclosed in this Background section is only for enhancement of understanding of the background of the described technology, and therefore it may contain information that does not form the prior art that is already known in this country to a person of ordinary skill in the art.

SUMMARY

An embodiment is to provide a light emitting display device in which a display area is expanded or an area of a non-display area is reduced.

The technical objectives to be achieved by the disclosure are not limited to those described herein, and other technical objectives that are not mentioned herein would be clearly understood by a person skilled in the art from the description of the disclosure.

According to embodiments, a light emitting display device includes a first display area; and a second display area adjacent to the first display area, wherein the second display area includes a pixel driving part, a main light-emitting element directly connected to the pixel driving part, and an additional light-emitting element connected to the main light-emitting element, the additional light-emitting element overlaps a peripheral driving part in a plan view, the peripheral driving part generates a signal provided to the pixel driving part, the main light-emitting element and the additional light-emitting element each include a first electrode, an emission layer, and a second electrode, the pixel driving part is electrically connected to the second electrode of the main light-emitting element and the second electrode of the additional light-emitting element, and the second electrode of the additional light-emitting element and the second electrode of the main light-emitting element are separated by a separator.

The light emitting display device may further include an auxiliary cathode connection line electrically connecting the second electrode of the additional light-emitting element and the second electrode of the main light-emitting element, and at least part of the auxiliary cathode connection line may be covered by the separator.

The first electrode of the main light-emitting element and the first electrode of the additional light-emitting element may be electrically connected to a first driving voltage line.

The auxiliary cathode connection line may be insulated from the second electrode included in a light-emitting element displaying different colors.

The light emitting display device may further include a cathode connection line electrically connecting the second electrode of the main light-emitting element and the pixel driving part, the cathode connection line may have a triple layer structure, and the second electrode of the main light-emitting element and the cathode connection line may be in side-contact.

The light emitting display device may further include an auxiliary connecting member positioned in the side-contact between the second electrode of the main light-emitting element and the cathode connection line, and the auxiliary connecting member, the first electrode of the main light-emitting element, and the first electrode of the additional light-emitting element may include a same material.

A light emitting display device according to an embodiment includes a first display area; and a second display area adjacent to the first display area and including a light transmission region, wherein the second display area includes a pixel driving part, a main light-emitting element electrically connected to the pixel driving part, and an additional light-emitting element, the main light-emitting element and the additional light-emitting element each include a first electrode, an emission layer, and a second electrode, the pixel driving part is electrically connected to the second electrode of the main light-emitting element and the second electrode of the additional light-emitting element, and the second electrode of the additional light-emitting element and the second electrode of the main light-emitting element are separated by a separator.

The light emitting display device may further include an auxiliary cathode connection line electrically connecting the second electrode of the additional light-emitting element and the second electrode of the main light-emitting element, and at least part of the auxiliary cathode connection line may be covered by the separator.

The first electrode of the main light-emitting element and the first electrode of the additional light-emitting element may be electrically connected to a first driving voltage line.

The auxiliary cathode connection line may be insulated from the second electrode included in a light-emitting element displaying a different color.

The light emitting display device may further include a cathode connection line electrically connecting the second electrode of the main light-emitting element and the pixel driving part, the cathode connection line may have a triple layer structure, and the second electrode of the main light-emitting element and the cathode connection line may be in side contact.

The light emitting display device may further include an auxiliary connecting member disposed on the side contact between the second electrode of the main light-emitting element and the cathode connection line, and the auxiliary connecting member, the first electrode of the main light-emitting element, and the first electrode of the additional light-emitting element may include a same material.

A light emitting display device according to an embodiment includes a transistor disposed on a substrate; a planarization layer covering the transistor; a first electrode and an additional first electrode disposed on the planarization layer; a pixel definition layer having openings each exposing at least part of the first electrode and the additional first electrode; an auxiliary cathode connection line positioned on the pixel definition layer; a separator overlapping at least part of the auxiliary cathode connection line in a plan view and having a reversed tapered side wall; and a second electrode and an additional second electrode disposed on the pixel definition layer and divided by the separator, wherein the second electrode and the additional second electrode are electrically connected by the auxiliary cathode connection line.

At least part of the auxiliary cathode connection line may be covered by the separator.

The auxiliary cathode connection line may be insulated from the second electrode included in a light-emitting element displaying a different color.

The first electrode and the additional first electrode may be electrically connected to a first driving voltage line.

The light emitting display device may further include a cathode connection line electrically connecting the second electrode and the transistor, the cathode connection line may have a triple layer structure, and the second electrode and the cathode connection line may be in side contact.

The light emitting display device may further include an auxiliary connecting member positioned on the side contact between the second electrode and the cathode connection line, and the auxiliary connecting member may be formed of the same material as the first electrode and the additional first electrode.

The additional first electrode and the additional second electrode may be included in an additional light-emitting element, the additional light-emitting element may overlap a peripheral driving part in a plan view, and the peripheral driving part may generate a signal that is provided to a pixel driving part that includes the transistor.

The transistor, the first electrode, the additional first electrode, the second electrode, the additional second electrode, and the auxiliary cathode connection line may be disposed in a second display area, and the second display area may include a light transmission region.

According to embodiments, the display area may be expanded or the area occupied by the non-display area may be reduced by positioning the light-emitting element on the region where the camera is positioned or on the back surface of the peripheral driving part.

BRIEF DESCRIPTION OF THE DRAWINGS

FIG. 7 and FIG. 8 are schematic cross-sectional views that specifically show a connection of a light-emitting element in an embodiment of FIG. 5.

FIG. 14 is a schematic cross-sectional view specifically showing a connection of a light-emitting element in an embodiment of FIG. 13.

DETAILED DESCRIPTION OF THE EMBODIMENTS

Figure 1:
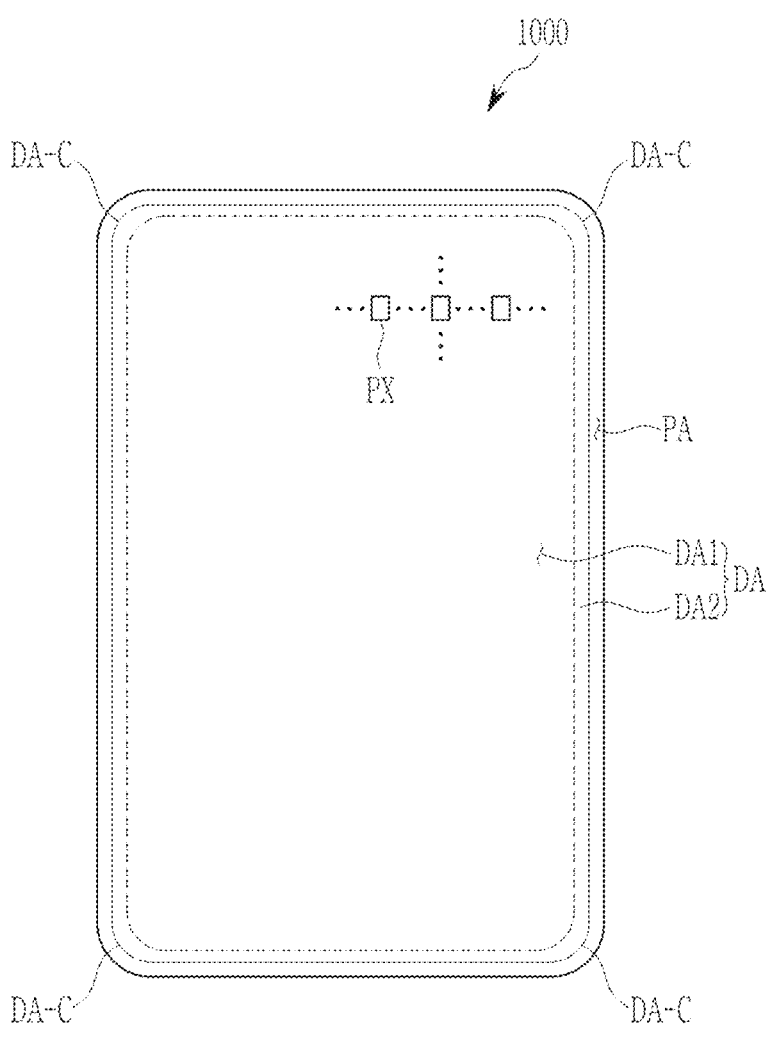
FIG. 1 is a schematic plan view of a light emitting display device according to an embodiment.
Figure 1:
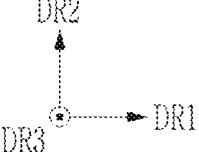

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

In order to clarify the disclosure, parts that are not directly relevant to the description may be omitted, and the same elements or equivalents may be referred to by the same reference numerals and/or reference characters throughout the specification.

Further, since sizes and thicknesses of constituent members shown in the accompanying drawings may be arbitrarily given for better understanding and ease of description, the disclosure is not limited to the illustrated sizes and thicknesses. In the drawings, the thickness of layers, films, panels, regions, etc., may be exaggerated for clarity. In the drawings, for better understanding and ease of description, thicknesses of some layers and areas may be excessively illustrated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", "include", "have", and their variations will be understood to imply the inclusion of stated elements but not the exclusion of any other elements.

Further, in the specification, the phrase "on a plane" or "in a plan view" means when an object is viewed from above, and the phrase "on a cross-section" or "in a cross-sectional view" means when a cross-section taken by vertically cutting an object is viewed from the side.

When an element is referred to as being "on," "connected to," or "coupled to" another element, it may be directly on, connected to, or coupled to the other element or intervening elements or layers may be present. When, however, an element is referred to as being "directly on," "directly connected to," or "directly coupled to" another element, there are no intervening elements or layers present. To this end, the term "connected" may refer to physical, electrical, and/or fluid connection, with or without intervening elements.

Also, throughout the specification, when it is said that parts such as a wire, a layer, a film, a region, a plate, and a constituent element are "extended in a first direction or a second direction", this does not mean only a straight line shape extending straight in the corresponding direction, but also includes a structure that is bent in part, has a zigzag structure, or extends while including a curved structure as a structure that extends overall in the first direction or the second direction.

In addition, electronic devices (e.g., a mobile phone, a TV, a monitor, a laptop computer, etc.) included in display devices and display panels described in the specification, or electronic devices included in display devices and display panels, etc., manufactured by manufacturing methods described in a specification, are not excluded from a scope of this specification.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, a schematic structure of a light emitting display device according to an embodiment is described through FIGS. 1 and 2.

Figure 2:
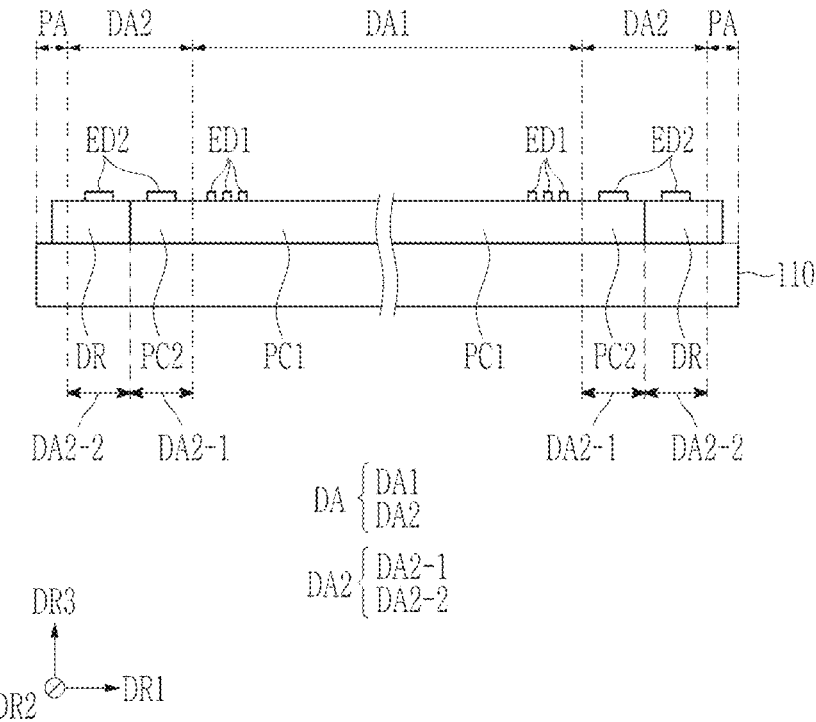
FIG. 2 is a schematic cross-sectional view of a part of FIG. 1.

FIG. 1 is a schematic plan view of a light emitting display device according to an embodiment, and FIG. 2 is a schematic cross-sectional view of a part of FIG. 1.

Referring to FIG. 1, a light emitting display device 1000 according to an embodiment may include a display area DA in which pixels PX is disposed and an image is displayed, and a non-display area PA adjacent to the display area DA. The non-display area PA may be a region in which images are not displayed.

The display area DA may have a rectangular shape as an example, and according to an embodiment, as illustrated in FIG. 1, each corner DA-C of the display area DA may have a round shape. The non-display area PA may have a shape surrounding the display area DA. However, the disclosure is not limited thereto, and the shapes of the display area DA and the non-display area PA may be designed in various ways.

The display area DA may include a first display area DA1 and a second display area DA2 positioned between the first display area DA1 and the non-display area PA.

The first display area DA1 may be positioned at the center of the display area DA, and the second display area DA2 may be positioned on sides (e.g., both sides) of the first display area DA1, for example, left and right. Also, in FIG. 1, the second display area DA2 may be positioned not only on sides in the first direction DR1 of the first display area DA1 but also on sides in the second direction DR2, e.g., upper and lower sides. However, this is only an example, and positions of the first display area DA1 and the second display area DA2 may be variously changed. For example, the first display area DA1 may be formed in a substantially quadrangle shape, and the second display area DA2 may be positioned on two or more sides and corners of the first display area DA1.

The non-display area PA may be formed in a form surrounding the display area DA. The non-display area PA may be a region in which an image is not displayed, and may be positioned on an outer portion of the light emitting display device 1000. At least part of the light emitting display device 1000 according to an embodiment may be a flexible display device including a bent portion. For example, a central portion of the light emitting display device 1000 may be flat, and an edge portion thereof may have a bent shape. In this case, at least a portion of the second display area DA2 may be positioned on the bent portion, so that at least a portion of the second display area DA2 may have a bent shape.

On the light emitting display device 1000, a surface on which the image is displayed may be parallel to the surface defined by the first direction DR1 and the second direction DR2. The third direction DR3 may indicate a normal direction of the surface on which the image is displayed, e.g., the thickness direction of the light emitting display device 1000. The front (or top) and back (or bottom) of each member may be distinguished by the third direction DR3. However, the directions indicated by the first to third directions DR1, DR2, and DR3 may be relative concepts and may be converted to other directions.

The light emitting display device 1000 may further include a touch part and/or a cover window on the upper side.

The light emitting display device 1000 may be a flat rigid display device or a flexible display device without being limited thereto. The light emitting display device according to an embodiment of the disclosure may include an organic or inorganic emission layer, and may also include a color conversion layer including quantum dots and/or a color filter.

FIG. 2 schematically illustrates a cross-section structure of the first display area DA1, the second display area DA2, and the non-display area PA of the light emitting display device 1000 according to an embodiment.

The light emitting display device 1000 may include a substrate 110 and pixel driving parts PC1 and PC2 positioned on the substrate 110, and light-emitting elements ED1 and ED2 receiving a light emission current from the pixel driving parts PC1 and PC2.

The light-emitting elements ED1 and ED2 may emit light (e.g., predetermined or selectable light) to display or express a luminance and/or a color. Here, the colors displayed may be light of red, green, and blue, or white. The light emitting display device 1000 may display an image through light emitted from the light-emitting elements ED1 and ED2.

The light-emitting elements ED1 and ED2 may include a first light-emitting element ED1 and a second light-emitting element ED2. The light-emitting element ED1 and ED2 may be disposed in the display area DA.

The first light-emitting element ED1 may be positioned in the first display area DA1, and the second light-emitting element ED2 may be positioned in the second display area DA2. Referring to FIG. 2, some of the second light-emitting elements ED2 may be disposed on the driving part DR. The light emitting display device 1000 according to an embodiment may include first light-emitting elements ED1 and second light-emitting elements ED2. The first light-emitting elements ED1 may be disposed in the first direction DR1 and the second direction DR2 in the first display area DA1, and the second light-emitting elements ED2 may be disposed in the first direction DR1 and the second direction DR2 in the second display area DA2. The size of the first light-emitting element ED1 and the size of the second light-emitting element ED2 may be the same or different. For example, the size of the second light-emitting element ED2 may be larger than the size of the first light-emitting element ED1. The number of the first light-emitting elements ED1 per unit area and the number of the second light-emitting elements ED2 per unit area may be the same or different. For example, the number of the second light-emitting elements ED2 per unit area may be less than the number of the first light-emitting elements ED1 per unit area. The resolution of the first display area DA1 and the resolution of the second display area DA2 may be the same or different. For example, the resolution of the first display area DA1 may be higher than that of the second display area DA2. The arrangement shape and the size of the first light-emitting element ED1 and the second light-emitting element ED2, and the resolution of the first display area DA1 and the second display area DA2, are not limited thereto and may be variously changed.

In the light emitting display device 1000 according to an embodiment, the pixel circuit parts PC1 and PC2 positioned on the substrate 110 may include a first pixel circuit part PC1 and a second pixel circuit part PC2. In FIG. 2, the first pixel circuit parts PC1 may represent a region where first pixel circuit parts PC1 are substantially disposed in the first direction DR1 and the second direction DR2, and the second pixel circuit parts PC2 may represent a region in which second pixel circuit parts PC2 are substantially disposed in the first direction DR1 and the second direction DR2. The arrangement shape of pixel circuit parts PC1 and PC2 is not particularly limited and may be arranged in various forms. The first pixel circuit part PC1 may be positioned in the first display area DA1, and the second pixel circuit part PC2 may be positioned in the second display area DA2. Each of the pixel circuit parts PC1 and PC2 may be electrically connected to at least one of light-emitting elements ED1 and ED2. A first pixel driving part PC1 may be electrically connected to a first light-emitting element ED1, and a second pixel driving part PC2 may be electrically connected to at least two second light-emitting elements ED2. The size of a first pixel driving part PC1 and the size of a second pixel driving part PC2 may be the same or different. For example, the size of a second pixel driving part PC2 may be greater than the size of a first pixel driving part PC1.

Figure 3:
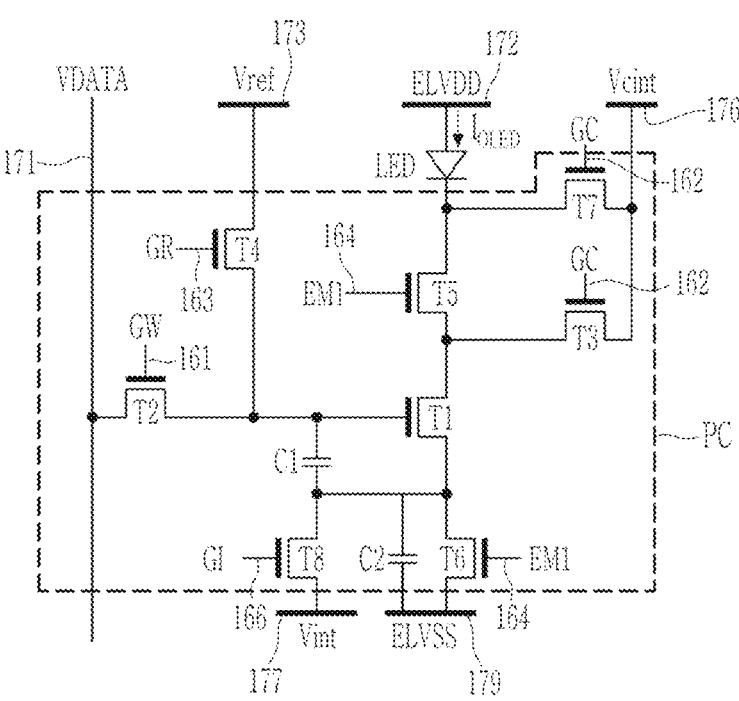
FIG. 3 is a schematic diagram of an equivalent circuit of a pixel included in a light emitting display device according to an embodiment.
Figure 4:
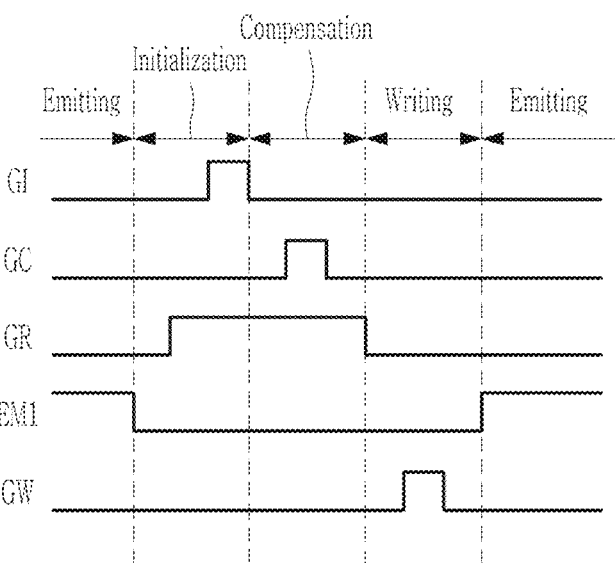
FIG. 4 is a schematic waveform diagram showing a signal applied to a pixel of FIG. 3.

Referring to FIG. 2, the light emitting display device 1000 according to an embodiment may further include a peripheral driving part DR positioned on the substrate 110. The peripheral driving part DR may play a role of generating and transmitting signals to operate the first pixel driving part PC1 and the second pixel driving part PC2, and may be electrically connected to the first pixel driving part PC1 and the second pixel driving part PC2. The peripheral driving part DR may include, for example, signal generating parts such as a scan signal generating part and a light emitting control signal generating part, and signal transmission wirings electrically connected thereto. The peripheral driving part DR may include a generation part that generates a first scan signal GW, a second scan signal GC, a third scan signal GR, a fourth scan signal GI, and a first light emission signal EM1, which are illustrated in FIGS. 3 and 4. The peripheral driving part (or peripheral driving unit) DR may further include a data driver or wiring (a driving voltage supply line, a common voltage supply line, etc.) that transmits a voltage. At least part of the peripheral driving part DR may be positioned in the second display area DA2, and part of the peripheral driving part DR may be positioned in the non-display area PA according to embodiments.

Light may be emitted from the first display area DA1 by the first light-emitting element ED1. In the first display area DA1, the first pixel driving part PC1 and the first light-emitting element ED1 receiving a light emission current from the first pixel driving part PC1 may be formed. At least part of the first light-emitting element ED1 may overlap (e.g., in a view or direction) the first pixel driving part PC1 electrically connected to the first light-emitting element ED1. Hereinafter, a first pixel driving part PC1 formed in the first display area DA1 and a first light-emitting element ED1 receiving the light emission current from the first pixel driving part PC1 may be collectively referred to as a first pixel or a normal pixel of the first display area DAL The first pixel driving part PC1 and the first light-emitting element ED1 may also be called a normal pixel driving part and a normal light-emitting element, respectively.

The second display area DA2 may be a region in which light is emitted by the second light-emitting element ED2, and may be divided into (or may include) a 2-1-th display area DA2-1 and a 2-2-th display area DA2-2. The 2-1-th display area DA2-1 may be a region in which the second pixel driving part PC2 is positioned, and the 2-2-th display area DA2-2 may be a region in which the peripheral driving part DR is positioned. The second light-emitting element ED2 may be positioned in the 2-1-th display area DA2-1 and the 2-2-th display area DA2-2, and the second light-emitting element ED2 may receive the light emission current from the second pixel driving part PC2. The second light-emitting element ED2 may be divided into the second light-emitting element ED2 positioned on the second pixel driving part PC2 and the second light-emitting element ED2 positioned on the peripheral driving part DR. The second light-emitting element ED2 positioned on the peripheral driving part DR may form the 2-2-th display area DA2-2 and receive the light emission current from at least part of the second pixel driving part PC2 positioned on the 2-1-th display area DA2-1. The second pixel driving part PC2 may be divided into (or include) the second pixel driving part PC2 that transmits and outputs for the second light-emitting element ED2 configuring (or forming) the 2-1-th display area DA2-1 and the second pixel driving part PC2 that transmits and outputs for the second light-emitting element ED2 configuring the 2-2-th display area DA2-2. Also, a second pixel driving part PC2 may transmit the output current to second light-emitting elements ED2, and at least one among second light-emitting elements ED2 may be positioned on the 2-2-th display area DA2-2 to be disposed on the peripheral driving part DR.

In a light emitting display device according to a comparative example, a pixel driving part and a light-emitting element may be positioned in a display area, and a light-emitting element may not be positioned in a region where a peripheral driving part is positioned. Therefore, an image cannot be displayed in a non-display area in which the peripheral driving part is positioned, and a dead space may be formed. On the other hand, in the light emitting display device according to an embodiment, part of the second light-emitting element ED2 may be positioned where the peripheral driving part DR is positioned so that the image may be displayed, and thus the display area in which the image is displayed may be expanded. For example, by positioning the second light-emitting element ED2 on the peripheral driving part DR, the dead space may be reduced and a region in which an image is not displayed may be reduced.

Hereinafter, the circuit structure of the light-emitting elements ED1 and ED2, and the pixel driving parts PC1 and PC2 is described with reference to FIGS. 3 to 5.

First, the pixel according to an embodiment, the signal applied thereto, and the operation thereof are described in detail with reference to FIGS. 3 and 4.

FIG. 3 is a schematic diagram of an equivalent circuit of a pixel included in a light emitting display device according to an embodiment.

Referring to FIG. 3, a pixel may include a light-emitting element LED and a pixel driving part PC driving the light-emitting element LED. The pixel driving part PC may include all of other elements except for a light-emitting element LED in FIG. 3, and the pixel driving part PC of the pixel according to an embodiment of FIG. 3 may include a first transistor T1, a second transistor T2, a third transistor T3, a fourth transistor T4, a fifth transistor T5, a sixth transistor T6, a seventh transistor T7, an eighth transistor T8, a first capacitor C1, and a second capacitor C2.

Also, the pixel driving part PC may be electrically connected to a first scan line 161 to which a first scan signal GW is applied, a second scan line 162 to which a second scan signal GC is applied, a third scan line 163 to which a third scan signal GR is applied, a fourth scan line 166 to which a fourth scan signal GI is applied, a first light emission signal line 164 to which a first light emission signal EM1 is applied, and a data line 171 to which a data voltage VDATA is applied. Also, the pixel may be electrically connected to a first driving voltage line 172 to which a driving voltage ELVDD (hereinafter referred to as a first driving voltage), a second driving voltage line 179 to which a driving low voltage ELVSS (hereinafter referred to as a second driving voltage), a reference voltage line 173 to which a reference voltage Vref is applied, a first initialization voltage line 177 to which a first initialization voltage Vint is applied, and a second initialization voltage line 176 to which a second initialization voltage Vcint is applied.

The circuit structure of the pixel is described below, focusing on each element (the transistor, the capacitor, the light-emitting element) included in the pixel.

The first transistor T1 (hereinafter referred to as a driving transistor) may include a gate electrode that is electrically connected to a first electrode of a first capacitor C1, a second electrode of a second transistor T2, and a second electrode of a fourth transistor T4, a first electrode (an input side electrode) electrically connected to a second electrode of the third transistor T3 and a second electrode of the fifth transistor T5, and a second electrode (an output side electrode) that is electrically connected to a first electrode of the sixth transistor T6, a second electrode of the eighth transistor T8, a second electrode of the first capacitor C1, and a second electrode of the second capacitor C2.

In the first transistor T1, the turned-on degree of the first transistor T1 may be determined according to the voltage of the gate electrode, and the magnitude of a current flowing from the first electrode to the second electrode of the first transistor T1 may be determined according to the turned-on degree. The current flowing from the first electrode of the first transistor T1 to the second electrode may be equal to a current flowing through the light-emitting element LED during a light emission period, so that it may also be referred to as a light emission current. The first transistor T1 may be formed as an n-type transistor, and a higher light emission current may flow as the voltage of the gate electrode increases. If the light emission current is large, the light-emitting element LED may display high luminance.

The second transistor T2 (hereinafter referred to as a data input transistor) may include a gate electrode electrically connected to a first scan line 161 to which the first scan signal GW is applied, a first electrode (an input side electrode) electrically connected to the data line 171 to which the data voltage VDATA is applied, and a second electrode (an output side electrode) electrically connected to the first electrode of the first capacitor C1, the gate electrode of the first transistor T1, and a second electrode of the fourth transistor T4. The second transistor T2 may input the data voltage VDATA into the pixel depending on the first scan signal GW, and the data voltage VDATA may be transmitted to the gate electrode of the first transistor T1 and stored in the first electrode of the first capacitor C1.

The third transistor T3 (hereinafter referred to as a first voltage transmission transistor or a second initialization voltage transmission transistor) may include a gate electrode electrically connected to the second scan line 162 to which the second scan signal GC is applied, a first electrode (an input side electrode) electrically connected to the second initialization voltage line 176 to which the second initialization voltage Vcint is applied, and a second electrode (an output side electrode) electrically connected to the first electrode of the first transistor T1 and the second electrode of the fifth transistor T5. The third transistor T3 may allow the second initialization voltage Vcint to be transferred to the first transistor T1 without passing through the light-emitting element LED. Here, the second initialization voltage Vcint may have a positive voltage value that is similar to the first driving voltage ELVDD. According to an embodiment, a first driving voltage ELVDD or a bias voltage may be applied instead of the second initialization voltage Vcint. The third transistor T3 may be provided to transmit the second initialization voltage Vcint to the first transistor T1 through a separate path, since the light-emitting element LED may emit light unnecessarily in case that the current flows through the light-emitting element LED. Therefore, the third transistor T3 may not be turned on during the light emission period and may be turned on during other periods.

The fourth transistor T4 (hereinafter referred to as a reference voltage transmission transistor) may include a gate electrode electrically connected to a third scan line 163 to which a third scan signal GR is applied, a first electrode electrically connected to the reference voltage line 173, and a second electrode electrically connected to the first electrode of the first capacitor C1, the gate electrode of the first transistor T1, and the second electrode of the second transistor T2. The fourth transistor T4 may serve to transfer the reference voltage Vref to the first electrode of the first capacitor C1 and the gate electrode of the first transistor T1 for initialization.

The fifth transistor T5 (hereinafter referred to as a cathode connection transistor) may include a gate electrode electrically connected to a first light emission signal line 164 to which a first light emission signal EM1 is applied, a first electrode electrically connected to the cathode of the light-emitting element LED and a second electrode of the seventh transistor T7, and a second electrode electrically connected to the first electrode of the first transistor T1 and the second electrode of the third transistor T3. The fifth transistor T5 may electrically connect the first electrode of the first transistor T1 and the light-emitting element LED based on the first light emission signal EM1 to form a current path so that the light-emitting element LED may emit light.

The sixth transistor T6 (hereinafter referred to as a driving low voltage application transistor) may include a gate electrode electrically connected to the first light emission signal line 164 to which the first light emission signal EM1 is applied, a first electrode electrically connected to the second electrode of the first transistor T1, the second electrode of the eighth transistor T8, the second electrode of the first capacitor C1, and the second electrode of the second capacitor C2, and a second electrode receiving the second driving voltage ELVSS. The sixth transistor T6 may serve to transmit or block the second driving voltage ELVSS to or from the second electrode of the first transistor T1 based on the first light emission signal EM1.

The seventh transistor T7 (hereinafter referred to as a second voltage transmission transistor) may include a gate electrode electrically connected to the second scan line 162 to which the second scan signal GC is applied, a first electrode (an input side electrode) electrically connected to the second initialization voltage line 176, and a second electrode (an output side electrode) electrically connected to the cathode of the light-emitting element LED and the first electrode of the fifth transistor T5. The seventh transistor T7 may serve to transmit the second initialization voltage Vcint to the cathode and may change the voltage level of the cathode into the second initialization voltage Vcint, thereby eliminating a problem of not displaying black due to the remaining charge on the cathode and clearly displaying black. Here, the second initialization voltage Vcint may have a positive voltage value that is similar to the first driving voltage ELVDD. According to an embodiment, the first driving voltage ELVDD or the bias voltage may be applied instead of the second initialization voltage Vcint.

The eighth transistor T8 (hereinafter referred to as a first initialization voltage transmission transistor) may include a gate electrode electrically connected to a fourth scan line 166 to which the fourth scan signal GI is applied, a first electrode (an input side electrode) electrically connected to the first initialization voltage line 177, and a second electrode (an output side electrode) electrically connected to the second electrode of the first transistor T1, the first electrode of the sixth transistor T6, the second electrode of the first capacitor C1, and the second electrode of the second capacitor C2. The eighth transistor T8 may serve to transmit the first initialization voltage Vint to the second electrode of the first transistor T1, the first electrode of the sixth transistor T6, the second electrode of the first capacitor C1, and the second electrode of the second capacitor C2 for initialization.

In the embodiment of FIG. 3, all transistors may be formed as n-type transistors, and each transistor may be turned on in case that the voltage of the gate electrode is at a high level, and may be turned off in case that the voltage is at a low level. The semiconductor layer included in each transistor may use a polycrystalline silicon semiconductor or an oxide semiconductor, and may additionally use an amorphous semiconductor or a single crystal semiconductor.

According to an embodiment, the semiconductor layer included in each transistor may further include an overlapping layer (or an additional gate electrode) overlapping the semiconductor layer, and a voltage may be applied to the overlapping layer (the additional gate electrode) to change the characteristics of the transistor, thereby improving the display quality of the pixel.

The first capacitor C1 may include a first electrode electrically connected to the gate electrode of the first transistor T1, the second electrode of the second transistor T2, and the second electrode of the fourth transistor T4, and a second electrode electrically connected to the second electrode of the first transistor T1, the first electrode of the sixth transistor T6, the second electrode of the eighth transistor T8, and the second electrode of the second capacitor C2. The first electrode of the first capacitor C1 may serve to receive and store the data voltage VDATA from the second transistor T2.

The second capacitor C2 may include a first electrode electrically connected to the second driving voltage line 179, and a second electrode electrically connected to the second electrode of the first transistor T1, the first electrode of the sixth transistor T6, the second electrode of the eighth transistor T8, and the second electrode of the first capacitor C1. The second capacitor C2 may serve to keep the voltages of the second electrode of the first transistor T1 and the second electrode of the first capacitor C1 constant. According to an embodiment, the first electrode of the second capacitor C2 may be electrically connected to the first driving voltage line 172, or the second capacitor C2 may be omitted.

The light-emitting element LED may include the anode electrically connected to the first driving voltage line 172 to receive the first driving voltage ELVDD, and the cathode electrically connected to the first electrode of the fifth transistor T5 and the second electrode of the seventh transistor T7. The cathode of the light-emitting element LED may pass through the fifth transistor T5 and may be electrically connected to the first transistor T1. The light-emitting element LED may be positioned between the pixel driving part PC and the first driving voltage ELVDD, so that the same current as the current flowing through the first transistor T1 of the pixel driving part PC flows, and the luminance may be determined according to the magnitude of the current. The light-emitting element LED may include an emission layer including at least one of an organic light emission material and an inorganic light emission material between the anode and the cathode. The detailed stacked structure of the light-emitting element LED according to the embodiment may be equal to that of FIG. 7.

The pixel according to the embodiment FIG. 3 may perform a compensation operation for detecting the change in the characteristic (a threshold voltage) of the first transistor T1 so as to display a constant display luminance regardless of the change in the characteristic of the first transistor T1.

Also, in FIG. 3, the light-emitting element LED may be positioned between the first electrode of the first transistor T1 and the first driving voltage line 172. The pixel according to the embodiment may also be referred to an inverted pixel to be distinguished from the pixel of which the light-emitting element is positioned between the first transistor T1 and the second driving voltage ELVSS. The light-emitting element may display the luminance according to the magnitude of the current flowing through the current path from the first driving voltage ELVDD to the second driving voltage ELVSS through the first transistor T1, and the larger the current, the higher the displayed luminance. In the inverted pixel structure of FIG. 3, since the light-emitting element LED is electrically connected to the first electrode of the first transistor T1 and electrically disconnected from the second electrode (the source electrode) of the first transistor T1, there may be a merit that the voltage of the second electrode (the source electrode) of the first transistor T1 is not changed in case that the voltage of each part of the pixel driving part PC is changed. More specifically, in case that the sixth transistor T6 is turned on, as the voltage of the second electrode of the first capacitor C1 decreases, the voltage of the first electrode of the first capacitor C1 may also decrease, and due to this, the output current output by the first transistor T1 may also be lowered, but in the embodiment, the problem of the output current of the first transistor T1 being lowered may be eliminated. This is described in detail while explaining the operation of FIG. 2.

In the embodiment of FIG. 3, it is described that a pixel PX may include the eight transistors T1 to T8 and two capacitors (the first capacitor C1, the second capacitor C2). However, the embodiments are not limited thereto. According to an embodiment, additional capacitors or transistors may be further included, and some capacitors or transistors may be omitted.

In the above, the circuit structure of the pixel according to an embodiment has been described with reference to FIG. 3.

Hereinafter, a waveform of signals applied to the pixel of FIG. 3 and an operation of the pixel according thereto are described in detail with reference to FIG. 4.

FIG. 4 is a schematic waveform diagram illustrating a signal applied to a pixel of FIG. 3.

Referring to FIG. 4, if the signal applied to the pixel is divided into periods, it is divided into an initialization period, a compensation period, a writing period, and a light emission period.

First, the light emission period may be a period that the light-emitting element LED emits light, a gate-on voltage (a voltage of a high level) may be applied as the first light emission signal EM1 so that the fifth transistor T5 and the sixth transistor T6 are turned on. A gate-off voltage (a voltage of a low level) may be applied as the first scan signal GW, the second scan signal GC, the third scan signal GR, and the fourth scan signal GI. As a result, a current path from the first driving voltage ELVDD to the second driving voltage ELVSS through the light-emitting element LED, the fifth transistor T5, the first transistor T1, and the sixth transistor T6 may be formed. The magnitude of the current flowing through the current path may be determined by the degree to which the channel of the first transistor T1 is turned on, and the degree to which the channel of the first transistor T1 is turned on may be determined by the voltage of the gate electrode of the first transistor T1 (or the first electrode of the first capacitor C1). Therefore, as the output current generated according to the voltage of the gate electrode of the first transistor T1 flows along the current path including the light-emitting element LED, the light-emitting element LED may emit light. In FIG. 4, the light emission period, which is discussed above, in which the light emission signal is applied as the gate-on voltage (the voltage of low level) is simplified. However, the embodiments are not limited thereto. For example, the light emission period (or other periods) may have longer or shorter periods.

As the first light emission signal EM1 is changed to the gate-off voltage (the voltage of a low level), the light emission period may end, and an initialization period may be entered.

Referring to FIG. 4, in the initialization period, the third scan signal GR may be first changed to the gate-on voltage (the voltage of a high level), and the fourth scan signal GI may be changed to the gate-on voltage (the voltage of a high level). The gate-off voltage (the voltage of a low level) is applied as the first scan signal GW, the second scan signal GC, and the first light emission signal EM1.

First, the fourth transistor T4 electrically connected to the third scan signal GR, which is changed to the gate-on voltage (the voltage of a high level) and applied, may be turned on, and the reference voltage Vref may be transmitted to the gate electrode of the first transistor T1 and the first electrode of the first capacitor C1 for initialization. Here, the reference voltage Vref may have a voltage value capable of turning on the first transistor T1.

After that, the fourth scan signal GI may also be applied after being changed into the gate-on voltage (the voltage of a high level), and the eighth transistor T8 may also be turned on, and as a result, the second electrode of the first transistor T1, a second electrode of the sixth transistor T6, the second electrode of the capacitor C1, and the second electrode of the second capacitor C2 may be initialized with the first initialization voltage Vint.

After that, as the fourth scan signal GI is changed to the gate-off voltage (the voltage of a low level), the initialization period may end, and a compensation period may be entered.

Referring to FIG. 4, in the compensation period, the third scan signal GR may be maintained as the gate-on voltage (the voltage of a high level), and the second scan signal GC may be changed to the gate-on voltage (the voltage of a high level). The gate-off voltage (the voltage of a low level) may be applied as the first scan signal GW, the fourth scan signal GI, and the first light emission signal EM1.

As the reference voltage Vref continues to be transmitted to the gate electrode of the first transistor T1 and the first electrode of the first capacitor C1 through the turned on fourth transistor T4, the third transistor T3 and the seventh transistor T7 may also be turned on by the additionally applied second scan signal GC of the gate-on voltage (the voltage of a high level), and the second initialization voltage Vcint may be transmitted to the first electrode of the first transistor T1 and the cathode of the light-emitting element LED. Since the first transistor T1 has the turn-on state by the reference voltage Vref, the Vgs value of the first transistor may be equal to the threshold voltage Vth value of the first transistor T1. Since Vgs is the value obtained by subtracting the voltage of the second electrode (the source electrode) of the first transistor T1 from the voltage of the gate electrode, the voltage value of the second electrode (the source electrode) of the first transistor T1 may have a lower voltage value (Vref-Vth) than the voltage of the gate electrode by the threshold voltage Vth of the first transistor T1. The turned on seventh transistor T7 may change the voltage level of the cathode to the first driving voltage ELVDD to initialize the voltage of the cathode to the first driving voltage ELVDD, and may remove the remaining charge from the cathode, thereby removing the problem of not displaying black.

After that, referring to FIG. 4, the second scan signal GC may be changed to the gate-off voltage (the voltage of a low level), the third scan signal GR may also be changed to the gate-off voltage (the voltage of a low level), and a writing period may be entered.

In the writing period, the first scan signal GW may be applied as the gate-on voltage (the voltage of a high level). The period during which the first scan signal GW is maintained at the gate-on voltage may be 1H. 1H may indicate a horizontal period, and the horizontal period may correspond to a horizontal synchronizing signal Hsync. 1H may mean a time during which a gate-on voltage is applied to a scan line of a next row after a gate-on voltage is applied to a scan line. On the other hand, in the writing period, the second scan signal GC, the third scan signal GR, the first light emission signal EM1, and the first light emission signal EM1 may be applied as the gate-off voltage (the voltage of a low level).

During the writing period, the second transistor T2 to which the gate-on voltage (the voltage of a high level) is applied may be turned on, and all other transistors may be turned off. As a result, the data voltage VDATA may enter the pixel and may be applied to the gate electrode of the first transistor T1 and the first electrode of the first capacitor C1. As in the compensation period, the voltage value of the second electrode of the first transistor T1 may have a lower voltage value (Vref-Vth) than the voltage of the gate electrode by the threshold voltage Vth of the first transistor T1.

Since the third transistor T3 and the fifth transistor T5 are turned off, the first electrode of the first transistor T1, the first driving voltage line 172, and the light-emitting element LED may be electrically disconnected.

After that, referring to FIG. 4, the first light emission signal EM1 may be changed to the gate-on voltage (the voltage of a high level) and enter the light emission period. The gate-off voltage (the voltage of a low level) may be applied as the first scan signal GW, the second scan signal GC, the third scan signal GR, and the fourth scan signal GI.

The fifth transistor T5 and the sixth transistor T6 may be turned on by the first light emission signal EM1, and a current path may be formed from the first driving voltage ELVDD to the second driving voltage ELVSS through the light-emitting element LED, the fifth transistor T5, the first transistor T1, and the sixth transistor T6. The magnitude of the current flowing along the current path may be determined by the degree to which the first transistor T1 is turned on, and the degree to which the first transistor T1 is turned on may be determined by the magnitude of the data voltage VDATA applied to the gate electrode. Depending on the magnitude of the current IDLED flowing along the current path, the light-emitting element LED may display different brightness.

As it enters the light emission period, the sixth transistor T6 may be turned on, and as a result, the voltages of the second electrode of the first capacitor C1 and the second electrode of the first transistor T1 may be changed to the second driving voltage ELVSS. In case that the voltage value of the second electrode of the first capacitor C1 is changed, the voltage value of the first electrode of the first capacitor C1 may also be changed accordingly. The voltage change value of the first electrode of the first capacitor C1 may be the same as the voltage value of the second electrode of the first capacitor C1.

In the writing period, since the voltage values of the second electrode of the first transistor T1 and the second electrode of the first capacitor C1 have a value (Vref-Vth) obtained by subtracting the threshold voltage Vth of the first transistor T1 from the reference voltage Vref value, as the writing period is changed to the light emission period, the voltage change value of the second electrode of the first capacitor C1 and the change value (ΔV) of the voltage of the first electrode of the first capacitor C1 are shown in Equation 1 below.

$$\Delta V = V_{ELVSS} - (V_{ref} - V_{th}) \qquad \text{[Equation 1]}$$

Here, Vref may be the voltage value of the reference voltage Vref, Vth may be the threshold voltage value of the first transistor T1, and $V_{ELVSS}$ may be the voltage value of the second driving voltage ELVSS.

The current IDLED flowing through the light-emitting element LED in the light emission period may be obtained by a formula shown in Equation 2 below.

$$I_{OLED} = k/2 \times (Vgs - V_{th})^2 = k/2 \times [(V_{data} + \Delta V \times V_{ELVSS}) - V^{th}]^2 = k/2 \times [(V_{data} + (V_{ELVSS} - V_{ref} + V_{th}) - V_{ELVSS}) - V_{th}]^2 = k/2 \times (V_{data} - V_{ref})^2 \qquad \text{[Equation 2]}$$

Here, k is a constant value, Vdata is the voltage value of the data voltage, Vref is the voltage value of the reference voltage Vref, Vth is the threshold voltage value of the first transistor T1, $V_{ELVSS}$ is the voltage value of the second driving voltage ELVSS, Vgs is the voltage difference between the gate electrode of the first transistor T1 and the second electrode, and ΔV uses the value of Equation 1.

Therefore, the value of the current $I_{OLED}$ flowing through the light-emitting element LED may be determined only by the value of the data voltage VDATA and the value of the reference voltage Vref, and may have a value independent of the threshold voltage Vth of the first transistor T1, so that it may have a merit of generating a constant output current $I_{OLED}$ despite the characteristic change of the first transistor T1.

Since the voltage change value ΔV generated at the gate electrode while the second driving voltage ELVSS is applied in the light emission period is also removed as in Equation 1, there is no need to consider it separately, and it may have a merit that the current does not change according to the characteristic of the first transistor T1 as the data voltage VDATA value and only the reference voltage Vref can be considered.

In the above, the voltage value of the first driving voltage ELVDD may be set higher than the value obtained by subtracting the threshold voltage value of the first transistor T1 from the voltage value of the reference voltage Vref, and the voltage value of the second driving voltage ELVSS may be set smaller than the value obtained by subtracting the threshold voltage value of the first transistor T1 from the voltage value of the reference voltage Vref.

In the above, the operation according to the pixel of FIG. 3 and the waveform in FIG. 4 has been described. Hereinafter, the circuit structure of the light-emitting elements ED1 and ED2, and the pixel driving parts PC1 and PC2 according to another embodiment, is described through FIG. 5.

Figure 5:
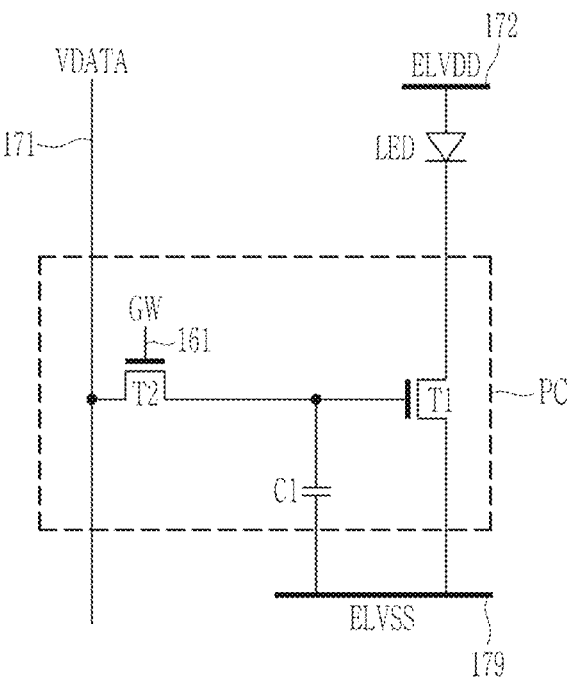
FIG. 5 is a schematic diagram of an equivalent circuit of a pixel included in a light emitting display device according to another embodiment.

FIG. 5 is a schematic diagram of an equivalent circuit of a pixel included in a light emitting display device according to another embodiment.

Referring to FIG. 5, a pixel may include a light-emitting element LED and a pixel driving part PC for driving it. The pixel driving part PC may include all other elements except for the light-emitting element LED in FIG. 5, and the pixel driving part PC of the pixel according to the embodiment of FIG. 5 may include a first transistor T1, a second transistor T2, and a first capacitor C1.

The pixel driving part PC may be electrically connected to the first scan line 161 to which the first scan signal GW is applied and the data line 171 to which the data voltage VDATA is applied. The pixel may be electrically connected to the first driving voltage line 172 to which the driving voltage ELVDD (a first driving voltage) is applied, and the second driving voltage line 179 to which the driving low voltage ELVSS (a second driving voltage) is applied.

The circuit structure of the pixel is as follows, focusing on each element (the transistor, the capacitor, the light-emitting element) included in the pixel.

The first transistor T1 (the driving transistor) may include a gate electrode electrically connected to the first electrode of the first capacitor C1 and the second electrode of the second transistor T2, a first electrode (an input side electrode) electrically connected to the cathode of the light-emitting element LED, and a second electrode (an output side electrode) receiving the second driving voltage ELVSS.

In the first transistor T1, the turned-on degree to which the first transistor T1 is turned on may be determined according to the voltage of the gate electrode, and the magnitude of the current flowing from the first electrode of the first transistor T1 to the second electrode may be determined according to the turned-on degree. The current flowing from the first electrode of the first transistor T1 to the second electrode may be be the same as the current flowing through the light-emitting element LED, so that it may also be referred to as a light emission current. Here, the first transistor T1 may be formed as an n-type transistor, and the higher light emission current may flow as the voltage of the gate electrode increases. If the light emission current is large, the light-emitting element LED may display high luminance.

The second transistor T2 (the data input transistor) may include a gate electrode electrically connected to the first scan line 161 to which the first scan signal GW is applied, a first electrode (an input side electrode) electrically connected to the data line 171 to which the data voltage VDATA is applied, and a second electrode (an output side electrode) electrically connected to the first electrode of the first capacitor C1 and the gate electrode of the first transistor T1. The second transistor T2 may input the data voltage VDATA into the pixel according to the first scan signal GW, and the data voltage VDATA may be transmitted to the gate electrode of the first transistor T1 and stored in the first electrode of the first capacitor C1.

All transistor may be formed as n-type transistors, and each transistor may be turned on in case that the voltage of the gate electrode is the voltage of a high level, and may be turned off in case that it is the voltage of a low level. The semiconductor layer included in each transistor may use a polycrystalline silicon semiconductor or an oxide semiconductor, and may additionally use an amorphous semiconductor or a single crystal semiconductor.

According to an embodiment, the semiconductor layer included in each transistor may further include an overlapping layer (or an additional gate electrode) overlapping it, and a voltage may be applied to the overlapping layer (the additional gate electrode) to change the characteristics of the transistor, thereby improving the display quality of the pixel.

The first capacitor C1 may include a first electrode electrically connected to the gate electrode of the first transistor T1 and the second electrode of the second transistor T2, and a second electrode receiving the second driving voltage (ELVSS). The first electrode of the first capacitor C1 may serve to receive and store the data voltage VDATA from the second transistor T2. According to an embodiment, the second electrode of the first capacitor C1 may serve to receive the first driving voltage ELVDD.

The light-emitting element LED may include an anode electrically connected to the first driving voltage line 172 to receive the first driving voltage ELVDD and a cathode electrically connected to the first electrode of the first transistor T1. The light-emitting element LED may be positioned between the pixel driving part PC and the first driving voltage ELVDD, so that the same current as the current flowing through the first transistor T1 of the pixel driving part PC flows, and the luminance may be determined according to the magnitude of the current. The light-emitting element LED may include an emission layer including at least one of an organic light emission material and an inorganic light emission material between the anode and the cathode. The specific stacked structure of the light-emitting element LED according to the embodiment may be equal to FIG. 7.

Also, in FIG. 5, the light-emitting element LED may be positioned between the first electrode of the first transistor T1 and the first driving voltage line 172. The pixel according to the embodiment may also be called an inverted pixel to be distinguished from the pixel of which the light-emitting element is positioned between the first transistor T1 and the second driving voltage ELVSS. The light-emitting element may display luminance according to the magnitude of the current flowing through the current path from the first driving voltage ELVDD to the second driving voltage ELVSS through the first transistor T1, and the larger the current, the higher the displayed luminance.

In the embodiment of FIG. 5, it is described that a pixel PX may include two transistors T1 and T2 and a capacitor (the first capacitor C1). However, the embodiments are not limited thereto. For example, according to an embodiment, an additional capacitor and/or an additional transistor may be further included.

Hereinafter, second pixels may be formed in the second display area DA2, and a connection relationship between light-emitting elements and a second pixel driving part according to an embodiment is schematically described through FIG. 6.

Figure 6:
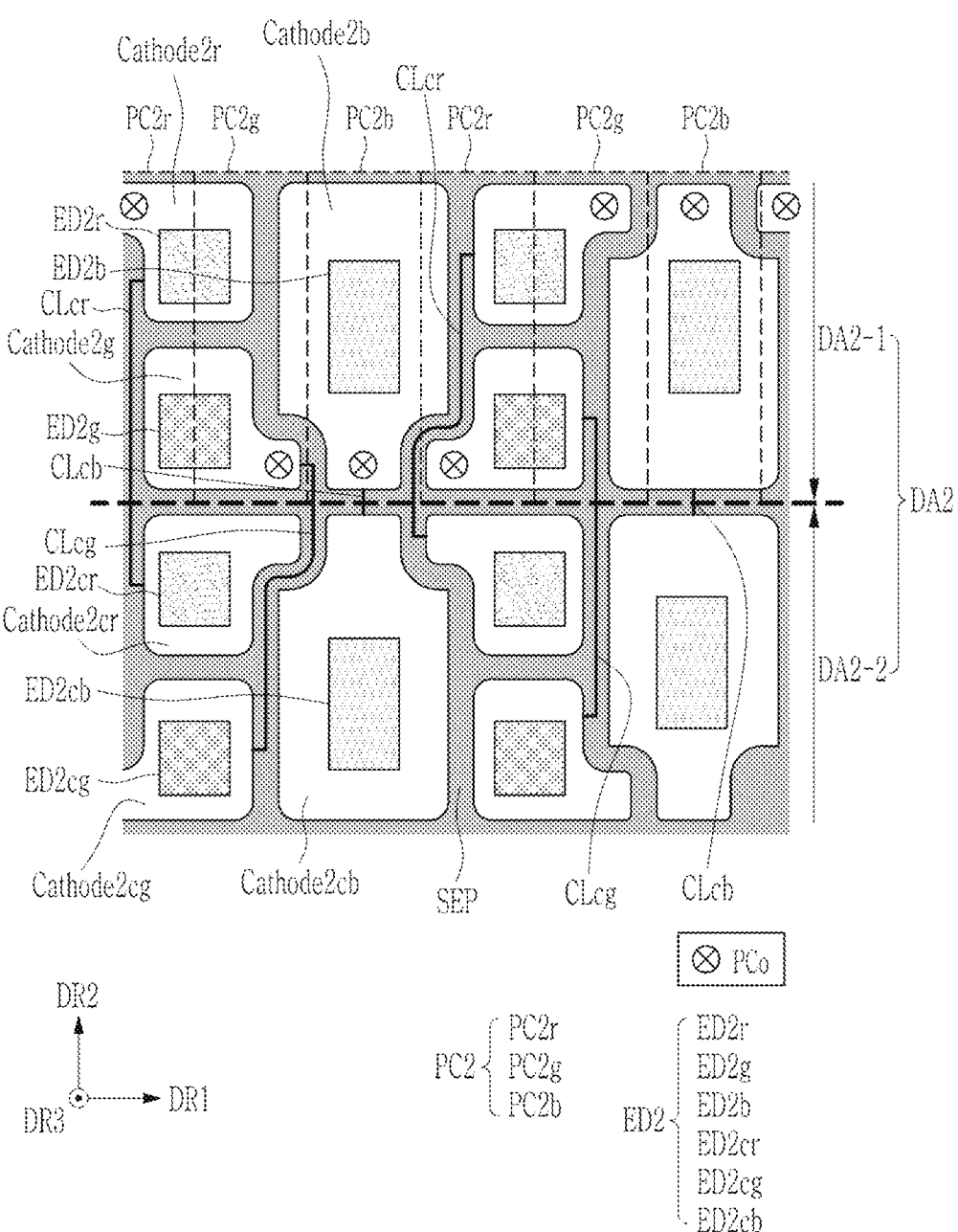
FIG. 6 is a schematic plan view schematically illustrating a connection between a pixel driving part and a light-emitting element according to an embodiment.

FIG. 6 is a plan view schematically illustrating a connection between a pixel driving part and a light-emitting element according to an embodiment.

FIG. 6 illustrates part of the second display area DA2, and the 2-1-th display area DA2-1 and the 2-2-th display area DA2-2 may be divided based on the first direction DR1. The second display area DA2 shown in FIG. 6 may be a second display area DA2 positioned in the opposite direction to the second direction DR2 of the first display area DA1 in FIG. 1, e.g., at the lower side, and the first display area DA1 may be positioned at the upper side in the second direction DR2 in FIG. 6.

For example, in FIG. 6, the second display area DA2 may be divided into two regions by a dotted line, the 2-1-th display area DA2-1 positioned at the upper side in the second direction DR2 may include the second pixel driving part PC2 and may be an overlapping area where the second light-emitting element ED2 and the second pixel driving part PC2 overlaps in a plan view. The 2-2-th display area DA2-2 positioned at the lower side in the second direction DR2 may include the peripheral driving part DR (not shown) rather than the second pixel driving part PC2. The 2-2-th display area DA2-2 may be a non-overlapping area in which the second light-emitting element ED2 and the second pixel driving part PC2 do not overlap each other in a plan view. Here, the light-emitting element may correspond to an emission layer EML2r or EMLc (see, e.g., FIG. 7) positioned at an opening of a pixel definition layer 380 (see, e.g., FIG. 7). Therefore, the 2-2-th display area DA2-2 may be a non-overlapping area where the emission layer EMLc (see, e.g., FIG. 7) positioned at the opening of the pixel definition layer 380 (see, e.g., FIG. 7) and the second pixel driving part PC2 do not overlap each other in a plan view. On the other hand, the 2-1-th display area DA2-1 may be an overlapping region where the emission layer EML2r (see, e.g., FIG. 7) positioned at the opening of the pixel definition layer 380 (see, e.g., FIG. 7) overlaps the second pixel driving part PC2 in a plan view. The first display area DA1 may also be an overlapping region in which the emission layer positioned at the opening of the pixel definition layer 380 (see, e.g., FIG. 7) and the first pixel driving part PC1 overlap in a plan view.

The second display area DA2 of FIG. 6 may be a region where light is emitted by the second light-emitting element ED2, and the second pixel driving part PC2, the second light-emitting element ED2, and the peripheral driving part may be positioned. The second pixel driving part PC2 may be electrically connected to the second light-emitting element ED2, so that the second pixel driving part PC2 supplies the current to the second light-emitting element ED2. A region where light is emitted by the second light-emitting element ED2 may correspond to the second display area DA2. The second light-emitting element ED2 positioned in the second display area DA2 may be divided into 2-1-th light-emitting elements ED2*r*, ED2*g*, and ED2*b* (hereinafter, referred to as second main light-emitting elements or a main light-emitting elements) positioned in the second pixel driving part PC2, and 2-2-th light-emitting elements ED2*cr*, ED2*cg*, and ED2*cb* (hereinafter, referred to as additional light-emitting elements) positioned on the peripheral driving part such as the scan signal generation part.

In detail, the second display area DA2 of FIG. 6 may include second pixel driving parts PC2*r*, PC2*g*, and PC2*b* and 2-1-th light-emitting elements ED2*r*, ED2*g*, and ED2*b*, which are positioned in the 2-1-th display area DA2-1, may further include 2-2-th light-emitting elements ED2*cr*, ED2*cg*, and ED2*cb* positioned in the 2-2-th display area DA2-2. Here, r, g, and b may mean red (R), green (G), and blue (B), respectively, and a second pixel driving part, a second main light-emitting element, and an additional light-emitting element, which represent a same color, may be electrically connected to each other.

In FIG. 6, the second pixel driving parts PC2*r*, PC2*g*, and PC2*b* are schematically shown as dotted lines, and may have the same circuit structure as those of FIG. 3 or 5. The second pixel driving parts PC2*r*, PC2*g*, and PC2*b* may be electrically connected to cathodes Cathode2*r*, Cathode2*g*, and Cathode2*b* of the 2-1-th light-emitting elements ED2*r*, ED2*g*, and ED2*b* through contact holes PCo. Also, the cathodes Cathode2*r*, Cathode2*g*, and Cathode2*b* (hereinafter, referring to main cathodes) of the 2-1-th light-emitting elements ED2*r*, ED2*g*, and ED2*b* may be electrically connected to additional cathodes Cathode2*cr*, Cathode2*cg*, and Cathode2*cb* of the 2-2-th light-emitting elements ED2*cr*, ED2*cg*, and ED2*cb* through auxiliary cathode connection lines CLcr, CLcg, and CLcb, respectively. As a result, the current output from the second pixel driving parts PC2*r*, PC2*g*, and PC2*b* may be transmitted to the cathodes Cathode2*r*, Cathode2*g*, and Cathode2*b* of the 2-1-th light-emitting elements ED2*r*, ED2*g*, and ED2*b* and the additional cathodes Cathode2*cr*, Cathode2*cg*, and Cathode2*cb* of the 2-2-th light-emitting elements ED2*cr*, ED2*cg*, and ED2*cb*. The additional cathodes Cathode2*cr*, Cathode2*cg*, and Cathode2*cb* of the 2-2-th light-emitting elements ED2*cr*, ED2*cg*, and ED2*cb* may be positioned in the 2-2-th display area DA2-2.

Figure 7:
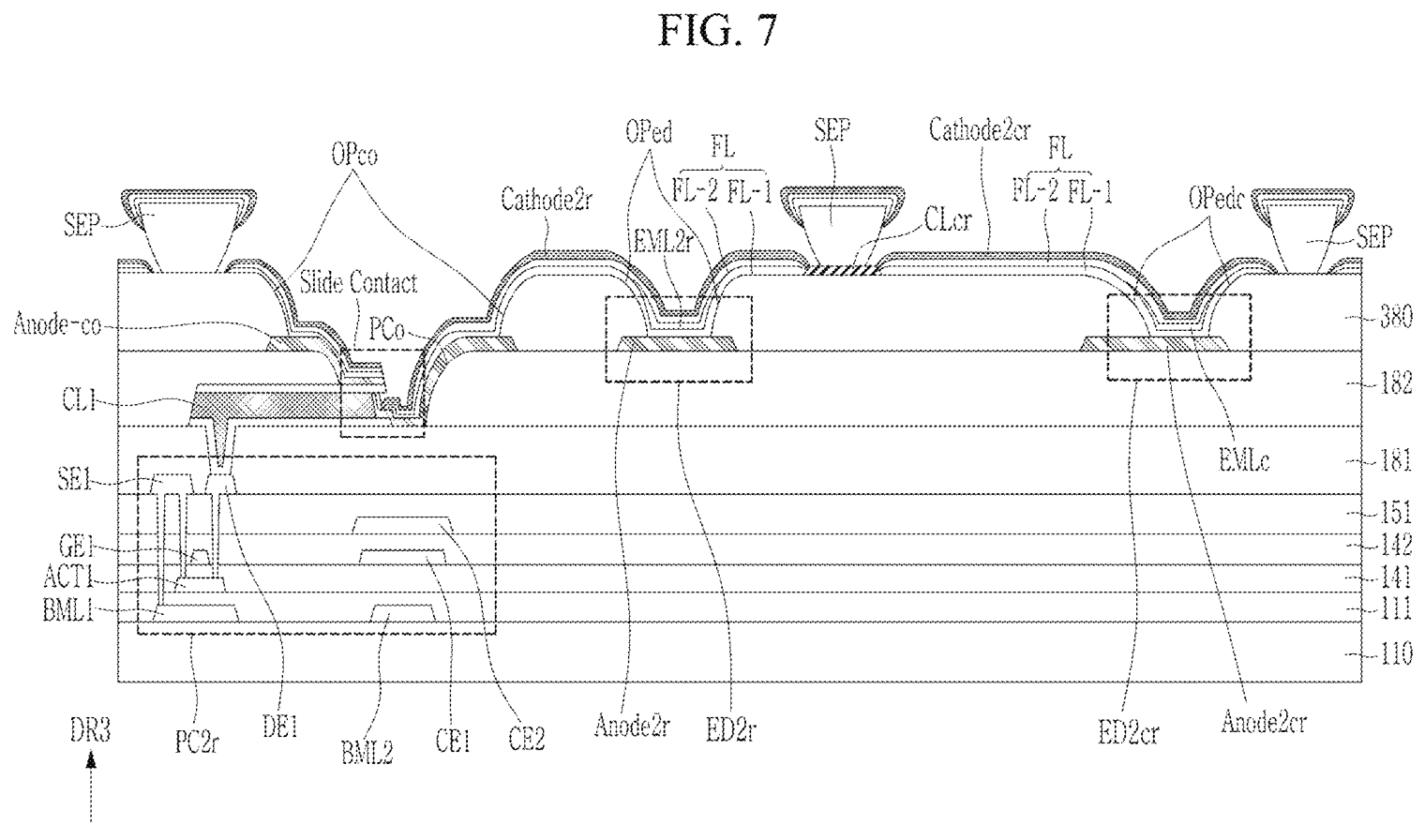

In FIG. 6, each light-emitting element ED2*r*, ED2*g*, ED2*b*, ED2*cr*, ED2*cg*, and ED2*cb* is shown on each cathode Cathode2*r*, Cathode2*g*, Cathode2*b*, Cathode2*cr*, Cathode2*cg*, and Cathode2*cb*, and the corresponding position may correspond to the region where the emission layer EML2*r* and EMLc (see, e.g., FIG. 7) included in each light-emitting element ED2*r*, ED2*g*, ED2*b*, ED2*cr*, ED2*cg*, or ED2*cb*, or may corresponding to the opening OPed and OPedc (see, e.g., FIG. 7) of the pixel definition layer 380 of FIG. 7.

In FIG. 6, the main cathodes Cathode2*r*, Cathode2*g*, and Cathode2*b* and the additional cathodes Cathode2*cr*, Cathode2*cg*, and Cathode2*cb* may have an electrically disconnected structure except for the auxiliary cathode connection lines CLcr, CLcg, and CLcb and may be separated by a separator SEP. In FIG. 6, the separator SEP may correspond to a grayed part. The separator SEP may have a flat shape surrounding each cathode Cathode2*r*, Cathode2*g*, Cathode2*b*, Cathode2*cr*, Cathode2*cg*, and Cathode2*cb*, and as shown in FIG. 7, it may be a structure that protrudes upward and has a reversed taper structure. For example, the cathodes positioned on sides (e.g., both sides) of the separator SEP having the reverse tapered side walls may be electrically separated from each other.

A main cathode Cathode2*r*, Cathode2*g*, or Cathode2*b* and an additional cathode Cathode2*cr*, Cathode2*cg*, or Cathode2*cb* may be electrically connected by an auxiliary cathode connection line CLcr, CLcg, or CLcb. At least parts of the auxiliary cathode connection lines CLcr, CLcg, and CLcb may overlap the separator SEP in a plan view.

According to the above structure, since the second light-emitting element ED2 may also be positioned in the region where the peripheral driving part is formed, the display area DA having the extended area may be formed. According to an embodiment, a pixel driving part may be electrically connected to at least one scan line in order to generate a more accurate current to be provided to the light-emitting element, and the area occupied by the scan signal generation part may be increased. However, in the embodiment, the second light-emitting element ED2 may be positioned on the peripheral driving part such as the scan signal generation part to be included in the display area DA, so that the display area DA may not be reduced and the larger display area DA may be obtained.

In the embodiment of FIG. 6, a 2-2-th light-emitting element ED2*cr*, ED2*cg*, ED2*cb* may be electrically connected to a second pixel driving part PC2*r*, PC2*g*, PC2*b*, but according to an embodiment, two or more 2-2-th light-emitting elements ED2*cr*, ED2*cg*, ED2*cb* may be electrically connected to a second pixel driving part PC2*r*, PC2*g*, PC2*b*.

The second display area DA2 shown in FIG. 6 may be the second display area DA2 positioned in the opposite direction to the second direction DR2 of the first display area DA1 in FIG. 1, e.g., at the lower side. However, in the other second display area DA2 shown in FIG. 1, the second display area DA2 of the structure similar to FIG. 6 may be positioned. The 2-2-th display area DA2-2 may be disposed so as to be positioned outside the 2-1-th display area DA2-1, and the connection relationship may be equal to FIG. 6.

Figure 8:
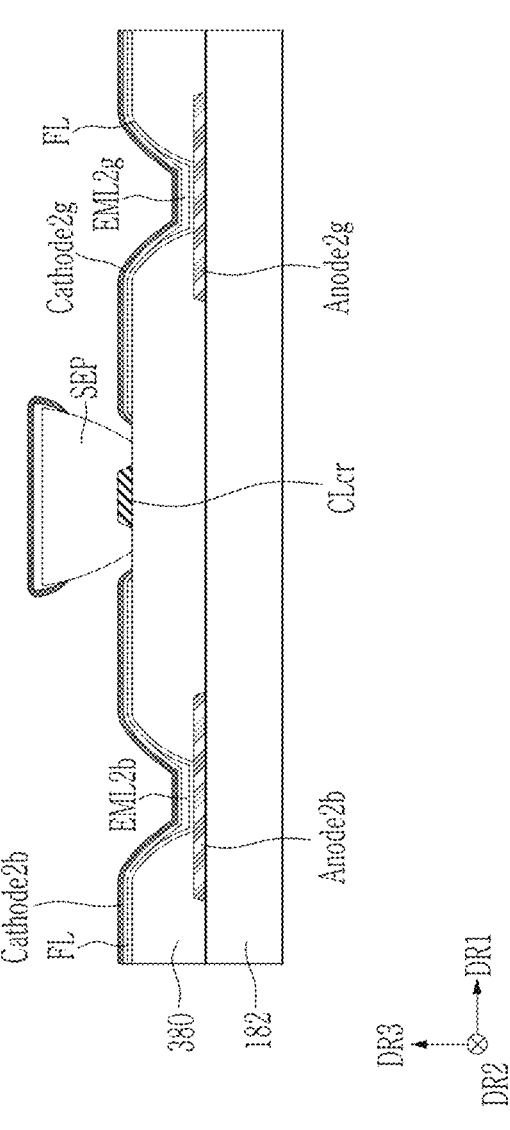

The planar structure of FIG. 6 as above described is described in more detail through the cross-section structure of FIGS. 7 and 8.

FIGS. 7 and 8 are schematic cross-sectional views illustrating a connection of a light-emitting element in an embodiment of FIG. 5 in detail.

FIG. 7 illustrates a 2-1-th light-emitting element ED2*r* and a 2-2-th light-emitting element ED2*cr* of red, and the lower second pixel driving part may be the second pixel driving part PC2*r* of red.

FIG. 7 schematically illustrates the structure positioned under planarization layers 181 and 182, e.g., a second pixel driving part PC2*r*, and illustrates only a transistor included in the second pixel driving part PC2*r*. The light-emitting element described in FIG. 6 above may correspond to the planar structure of the emission layer positioned at the opening of the pixel definition layer 380, and the light-emitting element may further include an anode and a cathode positioned above and below the emission layer. The anode may be positioned below or above the emission layer, and the cathode may be positioned on the opposite side of the anode. Therefore, instead of the distinguishing of the anode and the cathode, they may be named as a first electrode and a second electrode. Hereinafter, in a cross-sectional view, the first electrode, the pixel definition layer, the middle layer (including the emission layer), the second electrode may be referred to as a light-emitting element, and the conductive layer, the semiconductor layer, and the insulating layer positioned under the light-emitting element layer and configuring the transistor and the capacitor may be referred to as a driving element layer.

The structure from the substrate 110 to the planarization layers 181, and 182, e.g., the structure of the driving element layer, is as follows.

The first substrate 110 may include a material that does not bend due to a rigid characteristic such as glass, or a flexible material that can be bent such as plastic or polyimide. In the case of the flexible substrate, it may have a double-layered structure in which a polyimide layer and a barrier layer formed of an inorganic insulating material thereon is formed double.

On the first substrate 110, lower shielding layers BML1 and BML2 including a metal may be positioned. The lower shielding layer BML1 may overlap the channel of the transistor, and the other lower shielding layer BML2 may overlap the capacitor.

The first substrate 110 and the lower shielding layers BML1 and BML2 may be covered by a buffer layer 111. The buffer layer 111 may serve to block penetration of impurity elements into a first semiconductor layer ACT1, and may be an inorganic insulating layer including a silicon oxide (SiOx), a silicon nitride (SiNx), or a silicon oxynitride (SiO$_x$N$_y$).

On the buffer layer 111, a first semiconductor layer ACT1 formed of an oxide semiconductor or a polycrystalline semiconductor may be positioned. The first semiconductor layer ACT1 may include a channel of a polycrystalline silicon transistor including a driving transistor and a first region and a second region positioned on sides (e.g., both sides) of the channel. The polycrystalline silicon transistor may be another switching transistor as well as the driving transistor. Both sides of the channel of the first semiconductor layer ACT1 may have a region having a conductive layer characteristic by plasma treatment or doping, so that it may play the role of the first electrode and the second electrode of the transistor.

A first gate insulating layer 141 may be positioned on the first semiconductor layer ACT1. The first gate insulating layer 141 may be an inorganic insulating layer including a silicon oxide (SiOx), a silicon nitride (SiNx), a silicon oxynitride (SiO$_x$N$_y$), or the like.

A first gate conductive layer including a gate electrode GE1 of the polycrystalline silicon transistor and a first storage electrode CE1 that is an electrode of the first capacitor C1 may be positioned on the first gate insulating layer 141. According to an embodiment, the first storage electrode CE1 may be integral with the gate electrode GE1 of the driving transistor. In the first gate conductive layer, a scan line or a light emission control line may be formed in addition to the gate electrode GE1 of the polycrystalline silicon transistor. The first gate conductive layer may include a metal or a metal alloy such as copper (Cu), molybdenum (Mo), aluminum (Al), or titanium (Ti), and may be composed of a single layer or multiple layers.

After forming the first gate conductive layer, an exposed region of the first semiconductor layer may be made conductive by performing a plasma treatment or doping process. For example, the first semiconductor layer ACT1 covered by the gate electrode GE1 may not be conductive, and a portion of the first semiconductor layer ACT1 not covered by the gate electrode GE1, and the conductive layer may have same characteristics.

A second gate insulating layer 142 may be positioned on the first gate conductive layer and first gate insulating layer 141. The second gate insulating layer 142 may be an inorganic insulating layer including a silicon oxide (SiOx), a silicon nitride (SiNx), a silicon oxynitride (SiO$_x$N$_y$), or the like.

A second gate conductive layer including a second storage electrode CE2, which is an electrode of the first capacitor C1, may be positioned on the second gate insulating layer 142. The second gate conductive layer may include a metal or a metal alloy such as copper (Cu), molybdenum (Mo), aluminum (Al), or titanium (Ti), and may be composed of a single layer or multiple layers. In an embodiment, the second storage electrode CE2 may overlap an opening OPco formed in the pixel defining layer 380.

A first interlayer insulating layer 151 may be positioned on the second gate conductive layer. The first interlayer insulating layer 151 may include an inorganic insulating layer including a silicon oxide (SiOx), a silicon nitride (SiNx), a silicon oxynitride (SiO$_x$N$_y$), or the like, and according to an embodiment, an inorganic insulating material may be formed to be thick.

On the first interlayer insulating layer 151, a first data conductive layer including connecting members SE1 and DE1 respectively electrically connected to the first region and the second region of the first semiconductor layer ACT1 of the polycrystalline silicon transistor may be positioned. Referring to FIG. 7, the connecting member SE1 may be electrically connected not only to the first region of the first semiconductor layer ACT1, but also to the lower shielding layer BML1. The first data conductive layer may include a metal or metal alloy such as aluminum (Al), copper (Cu), molybdenum (Mo), titanium (Ti), etc., and may be composed of a single layer or multiple layers.

A first planarization layer 181 may be positioned on the first data conductive layer. The first planarization layer 181 may be an organic insulator including an organic material, and the organic material may include at least one material selected from the group consisting of polyimide, polyamide, acryl resin, benzocyclobutene, and phenol resin.

A second data conductive layer including a cathode connection line CL1 may be positioned on the first planarization layer 181. The second data conductive layer may include a data line or a first voltage line. The second data conductive layer may include a metal or metal alloy such as aluminum (Al), copper (Cu), molybdenum (Mo), or titanium (Ti), and may be composed of a single layer or multiple layers. The cathode connection line CL1 may be electrically connected to the connecting member DE through an opening positioned in the first planarization layer 181. In the embodiment of FIG. 7, the cathode connection line CL1 and the first data conductive layer may have a triple layer structure, the triple layer structure may have a lower layer and an upper layer including titanium (Ti), and an intermediate layer including aluminum (Al) may be placed between the lower layer and the upper layer.

A second planarization layer 182 may be positioned on the second data conductive layer, and the second planarization layer 182 may be an organic insulating layer, and may include at least one material selected from the group consisting of polyimide, polyamide, acryl resin, benzocyclobutene, and phenol resin.

On the second planarization layer 182, each anode Anode2r and Anode2cr and an auxiliary connecting member Anode-co of the light-emitting elements ED2r and ED2cr may be formed. The auxiliary connecting member Anode-co and the anodes Anode2r and Anode2cr may be formed of a same material.

The anode Anode2r (hereinafter referred to as a second main anode or a main anode) of the 2-1-th light-emitting element ED2$r$ and the anode Anode2$cr$ (hereinafter referred to as an additional anode) of the 2-2-th light-emitting element ED2$cr$ may be electrically connected to the first driving voltage line 172 to receive the first driving voltage ELVDD.

The auxiliary connecting member Anode-co may be positioned near the contact hole PCo and may play an auxiliary role of helping to electrically connect the cathode Cathode2$r$ and the cathode connection line CL1 through the contact hole PCo. Also, for the auxiliary connecting member Anode-co, in the case of performing wet-etching to form the anode, silver (Ag) particles may be reduced or precipitated around the third data conductive layer including exposed aluminum (Al), and defects may occur due to this in subsequent processes, so that it is possible to prevent the generation of silver particles and remove the defects by forming the auxiliary connecting member Anode-co, which is an anode material, in the corresponding part. In the embodiment not having such a problem, if there is no problem in case that the cathode Cathode2$r$ and the cathode connection line CL1 are electrically connected, the auxiliary connecting member Anode-co may be omitted.

On the anodes Anode2$r$ and Anode2$cr$ and the auxiliary connecting member Anode-co, a pixel definition layer 380 having openings respectively exposing the anodes Anode2$r$ and Anode2$cr$ and the auxiliary connecting member Anode-co and covering at least part of the anodes Anode2$r$ and Anode2$cr$ and the auxiliary connecting member Anode-co may be positioned. The pixel definition layer 380 may be a black pixel definition layer formed of an organic material with a black color so that light applied from the outside is not reflected back to the outside, and according to an embodiment, it may be formed of a transparent organic material. Of the pixel definition layer 380, the openings exposing the anodes Anode2$r$ and Anode2$cr$ may correspond to the light-emitting elements ED2$r$, ED2$g$, ED2$b$, ED2$cr$, ED2$cg$, and ED2$cb$ in a plan view, and the boundary between the openings of the pixel definition layer 380 may correspond to the boundary between the light-emitting elements ED2$r$, ED2$g$, ED2$b$, ED2$cr$, ED2$cg$, and ED2$cb$.

An auxiliary cathode connection line CLcr and a separator SEP may be positioned on the pixel definition layer 380.

The auxiliary cathode connection line CLcr may be formed of a conductive material and may electrically connect the cathode Cathode2$r$ of the 2-1-th light-emitting element ED2$r$ and the additional cathode Cathode2$cr$ of the 2-2-th light-emitting element ED2$cr$.

The separator SEP may have the side wall with the reversed taper structure so that the layer positioned on the separator SEP may be electrically disconnected near the separator SEP. For example, in FIG. 7, a functional layer FL and the cathode positioned on the separator SEP are electrically disconnected from the side wall of the reversed taper. As a result, the cathodes Cathode2$r$ and Cathode2$cr$ may be electrically separated based on the separator SEP. The separator SEP and the pixel definition layer 380 may be formed of a same material, and may also be formed of different materials through a separate process.

The auxiliary cathode connection line CLcr may have a part overlapping the separator SEP, and may electrically connect the cathode Cathode2$r$ of the 2-1-th light-emitting element ED2$r$ and the additional cathode Cathode2$cr$ of the 2-2-th light-emitting element ED2$cr$ that are separated by the separator SEP.

A first functional layer FL-1 may be positioned on the pixel definition layer 380 and the separator SEP, and the first functional layer FL-1 may have a structure that is electrically disconnected near the separator SEP.

On the first functional layer FL-1, emission layers EML2$r$ and EMLc may be respectively positioned on the anodes Anode2$r$ and Anode2$cr$ exposed by the openings of the pixel definition layer 380.

A second functional layer FL-2 may be positioned on the first functional layer FL-1 and the emission layers EML2$r$ and EMLc, and the second functional layer FL-2 may have a structure that is disconnected near the separator SEP.

The first functional layer FL-1 and the second functional layer FL-2 may contact each other in the vicinity where the emission layers EML2$r$ and EMLc are not positioned.

Cathodes Cathode2$r$ and Cathode2$cr$ may be positioned on the second functional layer FL-2, and the two cathodes Cathode2$r$ and Cathode2$cr$ may be separated based on the separator SEP and respectively configure the cathode Cathode2$r$ of the 2-1-th light-emitting element ED2$r$ and the cathode Cathode2$cr$ of the 2-2-th light-emitting element ED2$cr$. On the other hand, the cathode Cathode2$r$ of the 2-1-th light-emitting element ED2$r$ and the additional cathode Cathode2$cr$ of the 2-2-th light-emitting element ED2$cr$ separated by the separator SEP may be electrically connected by the auxiliary cathode connection line CLcr.

The combination of the functional layer FL and the emission layer may be referred to as an intermediate layer. The functional layer FL may include at least one of auxiliary layers such as an electron injection layer, an electron transport layer, a hole transport layer, and a hole injection layer, the first functional layer FL-1 positioned under the emission layers EML2$r$ and EMLc may include a hole injection layer and/or a hole transport layer, and the second functional layer FL-2 positioned on the emission layers EML2$r$ and EMLc may include an electron transport layer and/or an electron injection layer.

The 2-1-th light-emitting element ED2$r$ may include the anode Anode2$r$, the emission layer EML2$r$, and the cathode Cathode2$r$, and may additionally further include the first functional layer FL-1 positioned between the anode Anode2$r$ and the emission layer EML2$r$, and the second functional layer FL-2 positioned between the emission layer EML2$r$ and the cathode Cathode2$r$.

On the other hand, the 2-2-th light-emitting element ED2$cr$ may include the anode Anode2$cr$, the emission layer EMLc, and the cathode Cathode2$cr$, and may additionally further include the first functional layer FL-1 positioned between the anode Anode2$cr$ and the emission layer EMLc, and the second functional layer FL-2 positioned between the emission layer EMLc and the cathode Cathode2$cr$.

The cathode Cathode2$r$ of the 2-1-th light-emitting element ED2$r$ and at least part of the functional layer FL positioned thereunder may overlap the auxiliary connecting member Anode-co and may be electrically connected to the cathode connection line CL1 through a contact hole PCo. In detail, in the embodiment of FIG. 7, the cathode connection line CL1 and the cathode Cathode2$r$ of the 2-1-th light-emitting element ED2$r$ may be electrically connected by a side contact method. For example, of the triple layer structure of the cathode connection line CL1, the intermediate layer including aluminum (Al) may be more etched than the lower and upper layers including titanium (Ti), and the cathode Cathode2$r$ of the 2-1-th light-emitting element ED2$r$ and the intermediate layer of the cathode connection line CL1 may have a structure in which they contact each other with the auxiliary connecting member Anode-co therebetween and are electrically connected. The auxiliary connecting member Anode-co may have a structure connected to the lower layer of the cathode connection line CL1. Since the side contact method of FIG. 7 is one of electrically connecting methods according to an embodiment, they may be electrically connected in various ways according to an embodiment.

The cathode connection line CL1 may be electrically connected to the auxiliary cathode connection line CLcr via the cathode Cathode2$r$ of the 2-1-th light-emitting element ED2$r$ and may also be electrically connected to the additional cathode Cathode2$cr$ of the 2-2-th light-emitting element ED2$cr$ by the auxiliary cathode connection line CLcr.

According to an embodiment, a spacer may be further formed on the pixel definition layer 380, and the spacer may have a tapered side wall to have a structure to prevent the cathode from being electrically disconnected.

FIG. 7 does not illustrate the structure on the cathode, but an encapsulation layer may be positioned according to an embodiment. The encapsulation layer may include at least one inorganic layer and at least one organic layer. However, the embodiments are not limited thereto. For example, in some embodiments, the encapsulation layer may have a triple-layer structure including a first inorganic encapsulation layer, an organic encapsulation layer, and a second inorganic encapsulation layer. The encapsulation layer may be provided for protecting the emission layers EML2$r$ and EMLc from moisture or oxygen that may be introduced from the outside. According to an embodiment, the encapsulation layer may include a structure in which an inorganic layer and an organic layer are sequentially further stacked each other.

According to an embodiment, a sensing insulating layer and sensing electrodes may be positioned on the encapsulation layer to detect a touch.

According to an embodiment, a film including a polarizer may be attached on the encapsulation layer to reduce reflection of external light, or a color filter or a color conversion layer may be further formed to improve color quality. A light blocking member may be positioned between the color filter or the color conversion layer. According to an embodiment, a layer in which a material (hereinafter, referred to as a reflection control material) capable of absorbing some wavelengths of external light is formed may be further included. According to an embodiment, the front surface of the light emitting display device may be covered with an additional planarization layer (also referred to as a planarization layer) to be planarized.

FIG. 7 is a schematic cross-sectional view taken along a cross-section line in a direction parallel to an extension direction of the auxiliary cathode connection line CLcr, and FIG. 8 is a schematic cross-sectional view taken along a cross-section line in a direction perpendicular to the extension direction of the auxiliary cathode connection line CLcr.

FIG. 8 illustrates only the second planarization layer 182 and the overlying structure, and the first planarization layer 181 and the underlying structure may be omitted. In FIG. 8, the first planarization layer 181 and the underlying structure may be the same as in FIG. 7.

Referring to FIG. 8, the auxiliary cathode connection line CLcr may be covered by the separator SEP, so that it is insulated from the adjacent cathodes Cathode2$b$ and Cathode2$g$ of other colors. The cathode Cathode2$b$ may configure the second main light-emitting element ED2$b$ of blue along with an anode Anode2$b$ and the emission layer EML2$b$, and the cathode Cathode2$g$ may configure the second main light-emitting element ED2$g$ of green along with an anode Anode2$g$ and the emission layer EML2$g$. The second main light-emitting elements ED2$g$ and ED2$b$ may further include a functional layer FL.

In the embodiment of FIG. 8, the auxiliary cathode connection line CLcr may be positioned on the middle of the separator SEP, thereby having the covered structure as a whole.

Figure 9:
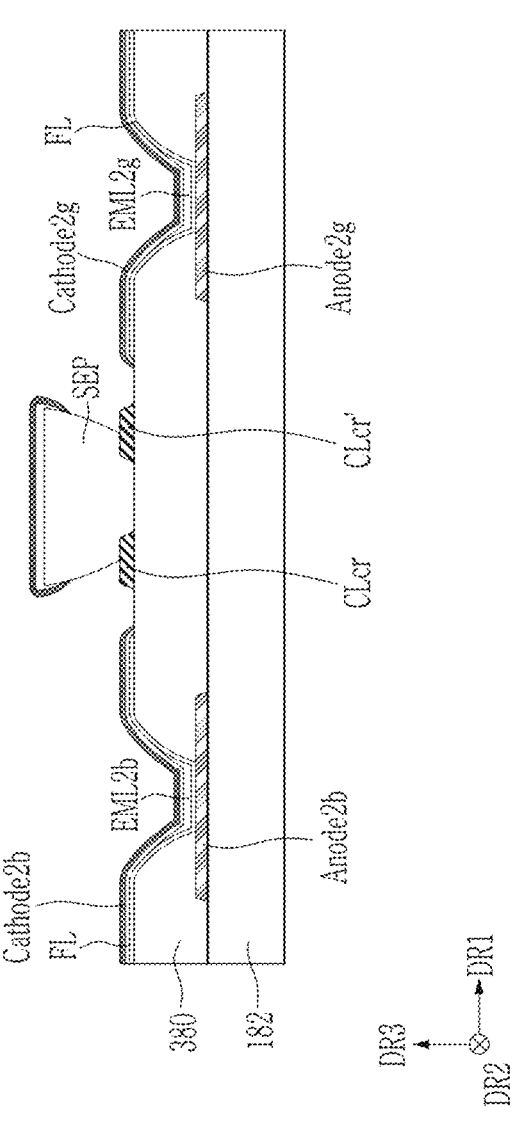
FIG. 9 is a schematic cross-sectional view of a light emitting display device according to another embodiment.

However, according to an embodiment, only a partial region of the auxiliary cathode connection line CLcr may be covered by the separator SEP, and this embodiment is shown in FIG. 9.

FIG. 9 is a schematic cross-sectional view of a light emitting display device according to another embodiment.

FIG. 9 is a schematic cross-sectional view similar to that of FIG. 8, but unlike FIG. 8, two auxiliary cathode connection lines CLcr and CLcr' are shown. Only some regions of two auxiliary cathode connection lines CLcr and CLcr' may be covered with the separator SEP, and they may not be electrically connected to the adjacent cathodes Cathode2$b$ and Cathode2$g$ of other colors, so that they are insulated from each other. According to an embodiment, only one of the two auxiliary cathode connection lines CLcr and CLcr' of FIG. 9 may be formed. Also, by the two auxiliary cathode connection lines CLcr and CLcr', two cathodes Cathode2$r$ and Cathode2$cr$ may not be electrically connected, and the respective auxiliary cathode connection lines CLcr and CLcr' may electrically connect different cathodes. For example, by two auxiliary cathode connection lines CLcr shown in the embodiment of FIG. 9, the cathode Cathode2$r$ of the 2-1-th light-emitting element ED2$r$ and the additional cathode Cathode2$cr$ of the 2-2-th light-emitting element ED2$cr$, which are separated by the separator SEP, may be electrically connected. Another auxiliary cathode connection line CLcr' may electrically connect another cathode.

In the above, the light emitting display device having the same structure as FIG. 1 has been described, and in the embodiment of FIG. 1, the second display area DA2 may be positioned along an outer edge of the first display area DA1.

Figure 10:
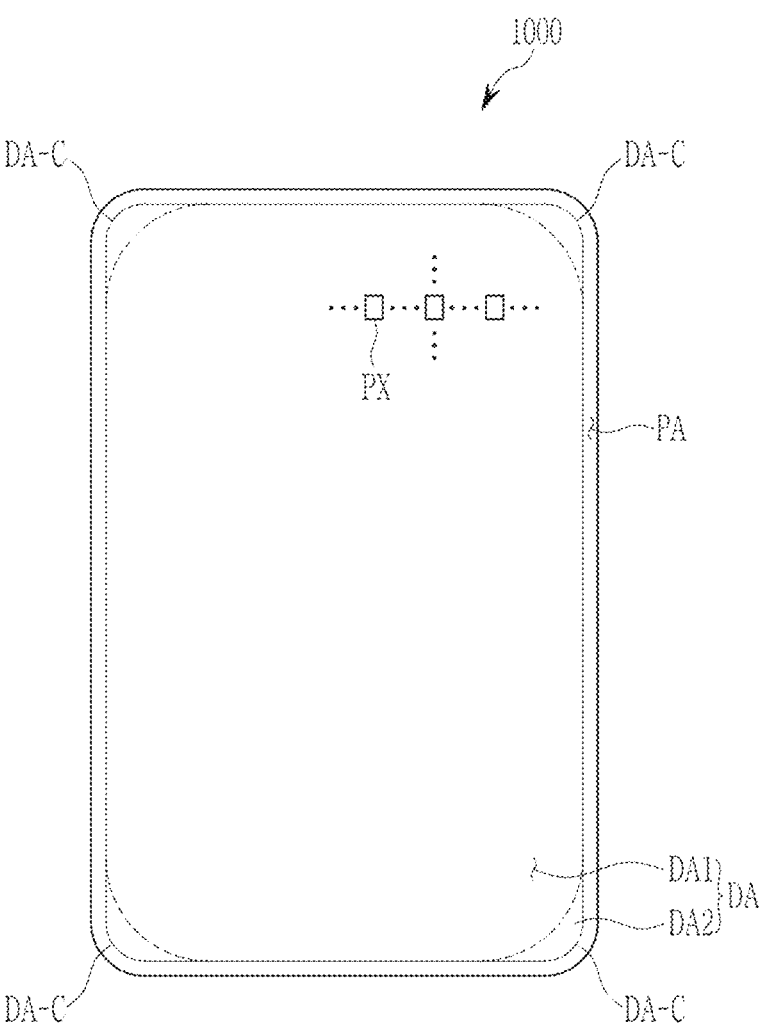
FIG. 10 is a schematic plan view of a light emitting display device according to another embodiment.
Figure 10:
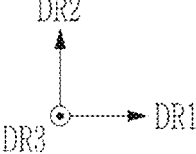

However, the second display area DA2 may be formed at the different positions from FIG. 1, and an embodiment of them is described through FIG. 10.

FIG. 10 is a schematic top plan view of a light emitting display device according to another embodiment.

In the light emitting display device according to the embodiment of FIG. 10, the second display area DA2 may only be positioned on corners DA-C of four places and the surroundings thereof, and thus may differ from that in the embodiment of FIG. 1. For example, the second display area DA2 may be positioned at a portion corresponding to the corner of the first display area DA1.

In FIG. 10, the non-display area PA formed in the corner DA-C of the light emitting display device may be reduced and be changed into the second display area DA2, and thus the light emitting display device may have a wider display area DA.

The embodiments of FIGS. 2 to 9 may also be applied to the light emitting display device according to the embodiment of FIG. 10. For example, part of the second display area DA2 positioned near the corner DA-C of FIG. 10 may overlap the peripheral driving part as shown in FIG. 2. Also, the embodiment of FIGS. 3 to 8 may be applied to the light emitting display device.

Figure 11:
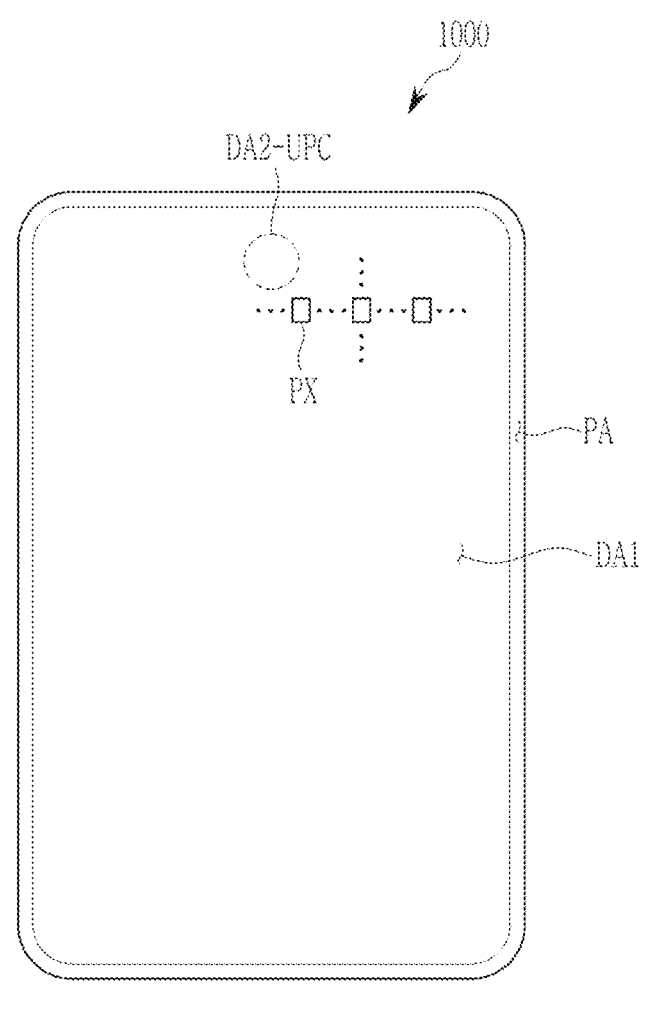
FIG. 11 is a schematic plan view of a light emitting display device according to an embodiment.
Figure 11:
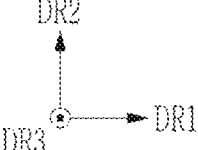

In the above, the embodiment in which the additional light-emitting element expands the display area while changing the non-display area positioned around the display area to the display area, and the embodiment in which the additional light-emitting element is positioned on the peripheral driving part for generating the signals operating the pixel, have been mainly described. However, the position where the additional light-emitting element may be positioned may vary, other than the outside of the display area or the upper part of the peripheral driving part. Hereinafter, an embodiment in which the additional light-emitting element is positioned in a component region DA2-UPC corresponding to a camera positioned on the rear surface of the component region DA2-UPC through FIG. 11 is described with reference to FIGS. 11 to 15. Hereinafter, the component region may also be referred to as a second display area including the light transmission region, the second display area including the light transmission region may be surrounded by the first display area, and the light transmission region may be a region for providing light to the camera.

First, a schematic structure of the light emitting display device is described with reference to FIGS. 11 and 12.

Figure 12:
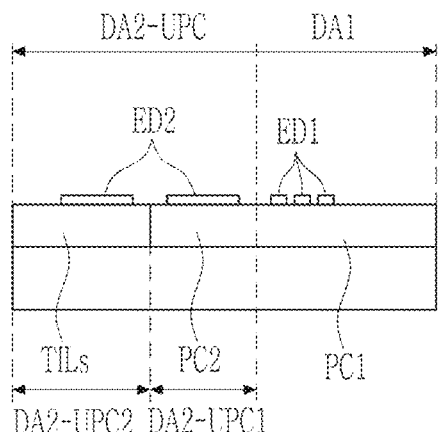
FIG. 12 is a schematic cross-sectional view of a part of FIG. 11.

FIG. 11 is a schematic plan view of a light emitting display device according to an embodiment, and FIG. 12 is a schematic cross-sectional view of a part of FIG. 11.

A light emitting display device 1000 according to an embodiment of FIG. 11 may include a component region DA2-UPC positioned in the first display area DA1 and surrounded by the first display area DA1.

The light emitting display device may include a light emission display panel, and a camera (not shown) may be disposed on the rear surface of the component region DA2-UPC of the light emission display panel. According to an embodiment, a sensor instead of the camera may be positioned on the rear surface of the component region DA2-UPC.

The component region DA2-UPC may include a region (hereinafter, also referred to as a light transmission region TA-UPC (see, e.g., FIGS. 13 and 15) composed of a transparent layer that allows light to pass therethrough and a pixel (hereinafter referred to as a second component pixel) that may display an image. In the light transmission region, a conductive layer or a semiconductor layer may not be positioned, a layer including a light blocking material, for example, a pixel definition layer and/or a light blocking member may include an opening overlapping the position corresponding to the component region DA2-UPC, thereby having a structure in which light is not blocked.

Since the structure of the first display area DA1 is the same as that of FIG. 2, hereinafter, the structure of the component region DA2-UPC is described as follows based on FIG. 12.

The component region DA2-UPC may include a second light-emitting element ED2 and a second pixel driving part PC2.

The component region DA2-UPC may have a light transmission region, may be a region in which light is emitted by the second light-emitting element ED2, and may be divided into a 2-1-th component region DA2-UPC1 and a 2-2-th component region DA2-UPC2. The 2-1-th component region DA2-UPC1 may be a region where the second pixel driving part PC2 is positioned, and the 2-2-th component region DA2-UPC2 may be a region where the light transmission region where a transparent insulating layer TILs is positioned is positioned. The transparent insulating layer TILs may be in a region in which light is not blocked because the region does not include a semiconductor layer or a conductive layer and is composed only of a transparent insulating layer. According to an embodiment, the light transmission region may be positioned in a region other than the 2-1-th component region DA2-UPC1 and the 2-2-th component region DA2-UPC2.

In the embodiment of FIG. 12, in the 2-1-th component region DA2-UPC1 and the 2-2-th component region DA2-UPC2, the second light-emitting element ED2, which receives light emission current from the second pixel driving part PC2, may be positioned. The second light-emitting element ED2 may be divided into a second light-emitting element ED2 positioned on the second pixel driving part PC2 and a second light-emitting element ED2 positioned on the transparent insulating layer TILs. The second light-emitting element ED2 positioned on the transparent insulating layer TILs may configure the 2-2-th component region DA2-UPC2 and may receive the light emission current from at least part of the second pixel driving part PC2 positioned in the 2-1-th component region DA2-UPC1. For example, the second pixel driving part PC2 may be divided into the second pixel driving part PC2 transmitting the output to the second light-emitting element ED2 configuring the 2-1-th component region DA2-UPC1, and the second pixel driving part PC2 transmitting the output to the second light-emitting element ED2 configuring the 2-2-th component region DA2-UPC2. Also, a second pixel driving part PC2 may transmit the output current to second light-emitting elements ED2, and at least one of second light-emitting element ED2 may be positioned in the 2-2-th component region DA2-UPC2 to be positioned on the transparent insulating layer TILs. In the 2-2-th component region DA2-UPC2, a portion excluding a portion where the second light-emitting element ED2 positioned on the transparent insulating layer TILs is positioned, may correspond to the light transmission region.

According to an embodiment, the number of the pixels per unit area of second component pixels may be smaller than the number of the pixels per unit area of the normal pixels included in first display area DAL As a result, the resolution of the second component pixel may be lower than that of the normal pixel. Also, a first pixel driving part PC1 may be electrically connected to a first light-emitting element ED1, and a second pixel driving part PC2 may be electrically connected to at least two second light-emitting elements ED2. The size of a first pixel driving part PC1 and the size of a second pixel driving part PC2 may be the same or different. For example, the size of a second pixel driving part PC2 may be greater than the size of a first pixel driving part PC1.

In a light emitting display device according to a comparative example, there was a drawback that a non-display area was positioned within the display area because a separate pixel or light-emitting element was not formed in the region where the camera was positioned within the display area. However, in the embodiment of FIG. 12, since the image may be displayed by positioning the pixel or the light-emitting element even in the component region DA2-UPC, it may have a merit that the non-display area is not positioned within the display area.

The pixel of the light emitting display device according to the embodiment of FIG. 12 may also have the pixel circuit as in FIGS. 3 and 5.

Figure 13:
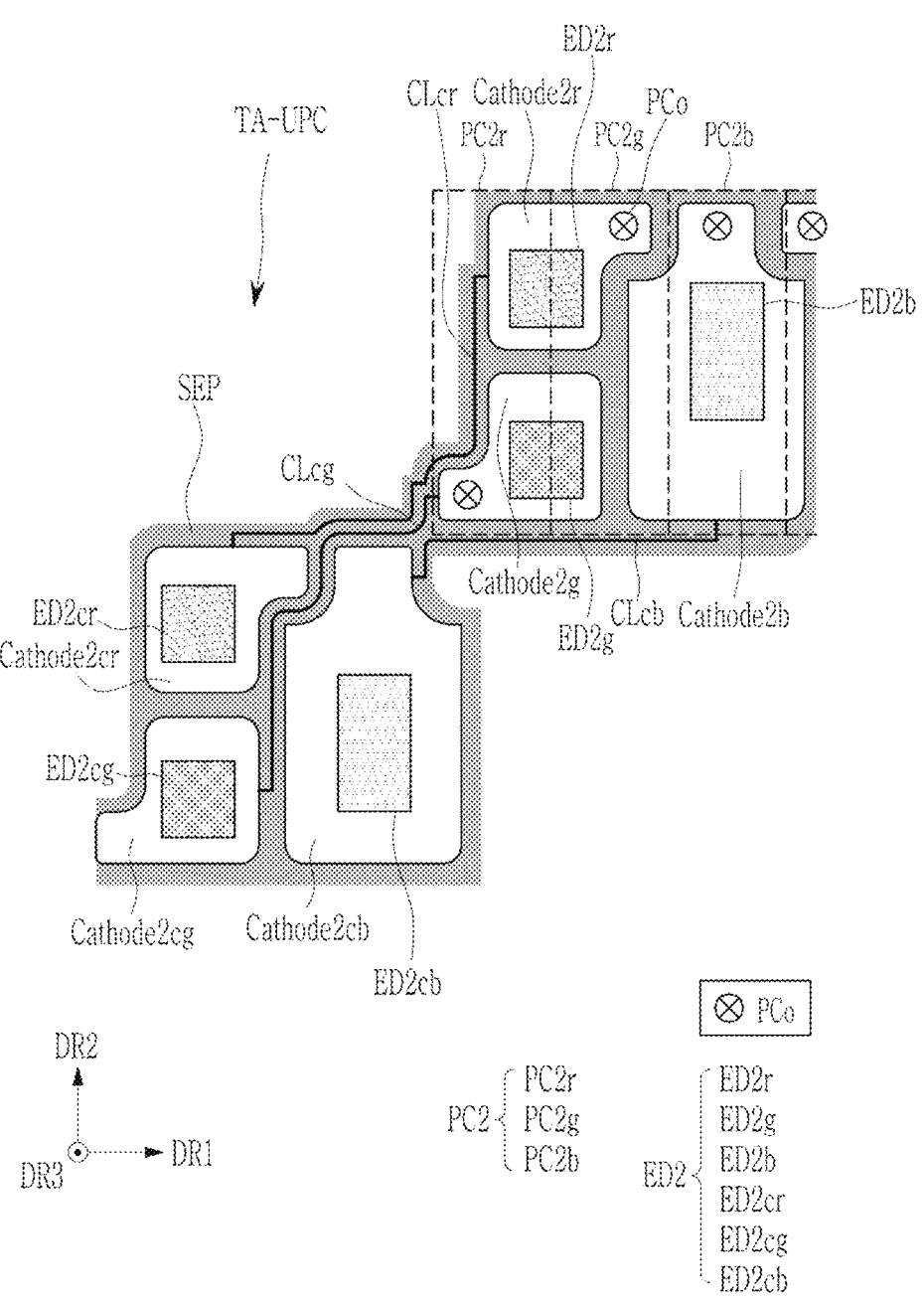
FIG. 13 is a schematic plan view schematically illustrating a connection between a pixel driving part and a light-emitting element according to an embodiment.
Figure 14:
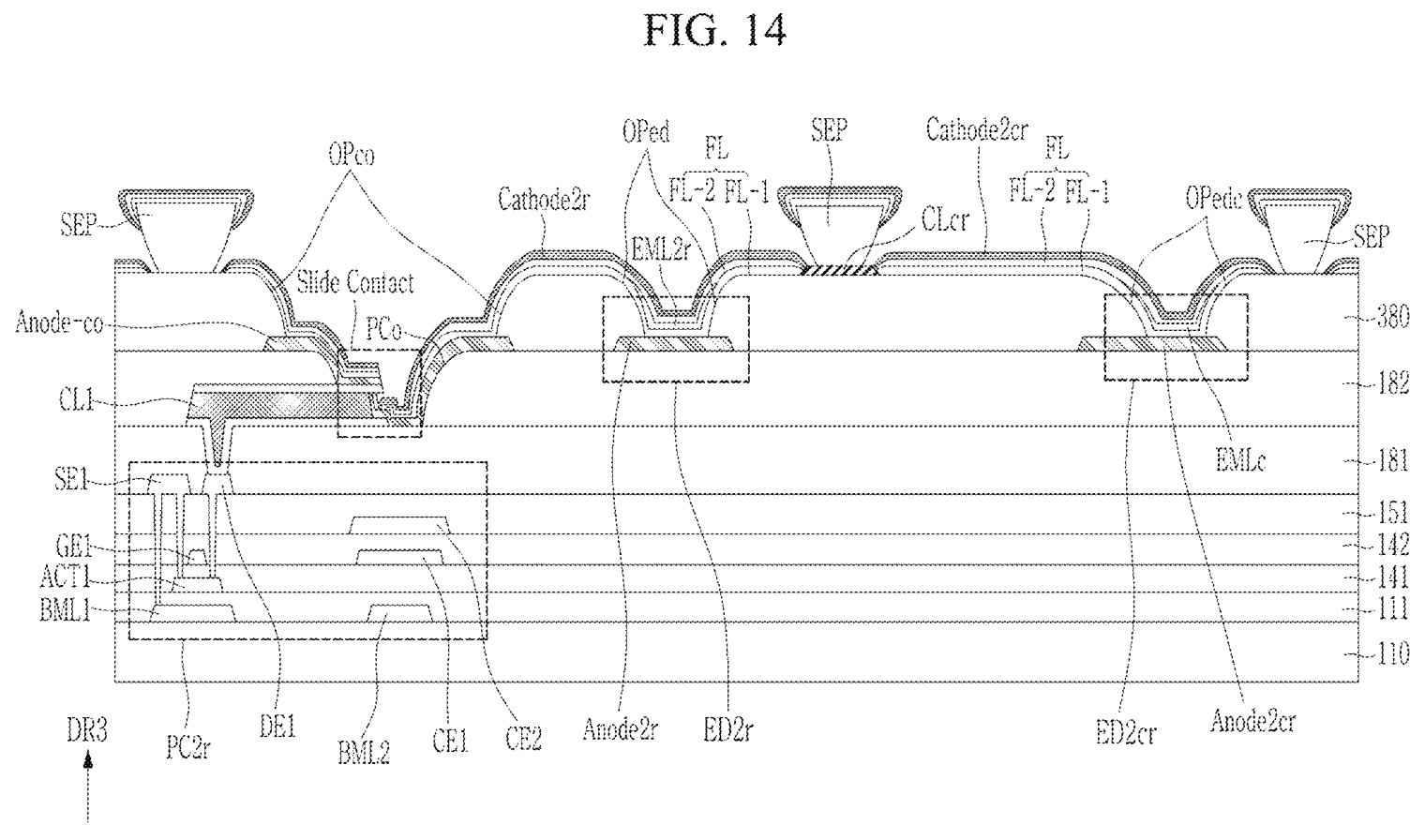
Figure 15:
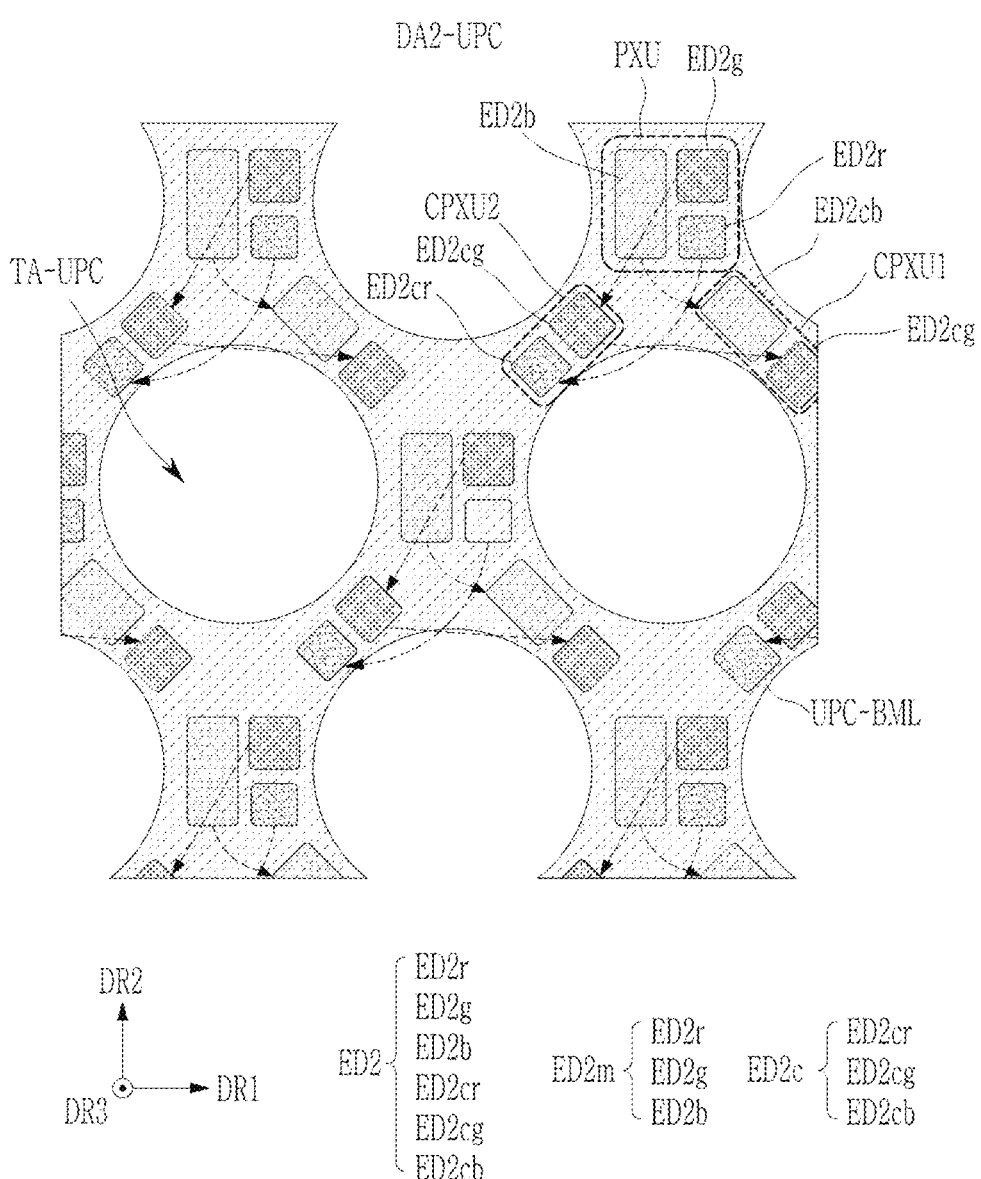
FIG. 15 is a schematic plan view of a light emitting display device according to another embodiment.

The detailed structure of the component region DA2-UPC is described through FIGS. 13 to 15, and first, the embodiment of FIGS. 13 and 14 is described.

First, the planar structure of the component region DA2-UPC is described through FIG. 13.

FIG. 13 is a plan view schematically illustrating a connection between a pixel driving part and a light-emitting element according to an embodiment.

FIG. 13 illustrates the second pixel driving parts PC2r, PC2g, and PC2b, the 2-1-th light-emitting element ED2r, ED2g, and ED2b, the 2-2-th light-emitting element ED2cr, ED2cg, and ED2cb, the contact hole PCo, the separator SEP, and the auxiliary cathode connection lines CLcr, CLcg, and CLcb, which are formed in the 2-1-th component region DA2-UPC1, and a light transmission region TA-UPC may be formed on a portion where they are not positioned.

According to FIG. 13, since the light transmission region TA-UPC is formed widely, a camera positioned on the rear surface of the light transmission region TA-UPC may photograph or detect the front surface of the light emitting display device through the light transmission region TA-UPC.

Of the component region DA2-UPC, in the region that is not the light transmission region TA-UPC, the 2-1-th light-emitting elements ED2*r*, ED2*g*, and ED2*b* and the 2-2-th light-emitting elements ED2*cr*, ED2*cg*, and ED2*cb*, which are electrically connected to the second pixel driving parts PC2*r*, PC2*g*, and PC2*b*, and the second pixel driving parts PC2*r*, PC2*g*, and PC2*b*, may be formed.

The second pixel driving parts PC2*r*, PC2*g*, and PC2*b* are schematically shown by a dotted line and may have the circuit structure as in FIG. 3 or 5. The second pixel driving parts PC2*r*, PC2*g*, and PC2*b* may be electrically connected to the cathode Cathode2*r*, Cathode2*g*, and Cathode2*b* of the 2-1-th light-emitting elements ED2*r*, ED2*g*, and ED2*b* through contact holes PCo, respectively. Also, the cathodes Cathode2*r*, Cathode2*g*, and Cathode2*b* (referred to as main cathodes) of the 2-1-th light-emitting elements ED2*r*, ED2*g*, and ED2*b* may be electrically connected to the additional cathodes Cathode2*cr*, Cathode2*cg*, and Cathode2*cb* of the 2-2-th light-emitting elements ED2*cr*, ED2*cg*, and ED2*cb* through the auxiliary cathode connection lines CLcr, CLcg, and CLcb, respectively. As a result, the current output from the second pixel driving parts PC2*r*, PC2*g*, and PC2*b* may be transmitted to the cathodes Cathode2*r*, Cathode2*g*, and Cathode2*b* of the 2-1-th light-emitting elements ED2*r*, ED2*g*, and ED2*b*, and the additional cathodes Cathode2*cr*, Cathode2*cg*, and Cathode2*cb* of the 2-2-th light-emitting element ED2*cr*, ED2*cg*, and ED2*cb*.

FIG. 13 illustrates each light-emitting element ED2*r*, ED2*g*, ED2*b*, ED2*cr*, ED2*cg*, and ED2*cb* on each cathode Cathode2*r*, Cathode2*g*, Cathode2*b*, Cathode2*cr*, Cathode2*cg*, and Cathode2*cb*, and the corresponding position may correspond to a region where an emission layer EML2*r* and EMLc (see, e.g., FIG. 14) included in each light-emitting element ED2*r*, ED2*g*, ED2*b*, ED2*cr*, ED2*cg*, and ED2*cb* is positioned, or an opening OPed and OPedc (see, e.g., FIG. 14) of a pixel definition layer 380 of FIG. 14.

In FIG. 13, the main cathodes Cathode2*r*, Cathode2*g*, and Cathode2*b*, and the additional cathodes Cathode2*cr*, Cathode2*cg*, and Cathode2*cb* may have the electrically disconnected structure except for the auxiliary cathode connection lines CLcr, CLcg, and CLcb and may be separated by the separator SEP. In FIG. 13, the separator SEP may correspond to a grayed portion. The separator SEP may have a flat shape surrounding each cathode Cathode2*r*, Cathode2*g*, Cathode2*b*, Cathode2*cr*, Cathode2*cg*, and Cathode2*cb*, and as shown in FIG. 14, it may be a structure that protrudes upward and has a reversed taper structure. For example, the cathodes positioned on sides (e.g., both sides) of the separator SEP may be electrically separated from each other by having the reverse tapered side wall.

A main cathode Cathode2*r*, Cathode2*g*, Cathode2*b* and an additional cathode Cathode2*cr*, Cathode2*cg*, Cathode2*cb* may be electrically connected by an auxiliary cathode connection line CLcr, CLcg, CLcb. At least part of the auxiliary cathode connection line CLcr, CLcg, CLcb may overlap the separator SEP in a plan view.

According to the above structure, while the component region DA2-UPC has the light transmission region TA-UPC, and by reducing the number of the second pixel driving parts PC2*r*, PC2*g*, and PC2*b*, and increasing the number of the light-emitting elements ED2*r*, ED2*g*, ED2*b*, ED2*cr*, ED2*cg*, and ED2*cb* electrically connected thereto, the light transmission region TA-UPC of the wide area may be formed, and all of the remaining regions may be formed as the display area capable of displaying the image.

In the embodiment of FIG. 13, a 2-2-th light-emitting element ED2*cr*, ED2*cg*, ED2*cb* may be electrically connected to a second pixel driving part PC2*r*, PC2*g*, PC2*b*, but according to an embodiment, two or more 2-2-th light-emitting elements ED2*cr*, ED2*cg*, ED2*cb* may be electrically connected to a second pixel driving part PC2*r*, PC2*g*, PC2*b*.

On the other hand, FIG. 14 illustrates the cross-sectional structure of the embodiment of FIG. 13.

FIG. 14 is a schematic cross-sectional view illustrating a connection of a light-emitting element in an embodiment of FIG. 13 in detail.

In FIG. 14, similar to FIG. 7, the 2-1-th light-emitting element ED2*r* and the 2-2-th light-emitting element ED2*cr* of red, and the underlying second pixel driving part may also be the second pixel driving part PC2*r* of red.

In FIG. 14, the structure positioned under the planarization layers 181 and 182 may be the same as that of FIG. 7 so that the description thereof is omitted.

On the second planarization layer 182, each anode Anode2*r* and Anode2*cr* and an auxiliary connecting member Anode-co of the light-emitting elements ED2*r* and ED2*cr* may be formed. The auxiliary connecting member Anode-co and the anodes Anode2*r* and Anode2*cr* may be formed of (or include) a same material.

The anode Anode2*r* of the 2-1-th light-emitting element ED2*r* and the anode Anode2*cr* of the 2-2-th light-emitting element ED2*cr* may be electrically connected to the first driving voltage line 172, thereby receiving the first driving voltage ELVDD.

The auxiliary connecting member Anode-co may be positioned near the contact hole PCo and may play an auxiliary role of helping to electrically connect the cathode Cathode2*r* and the cathode connection line CL1 through the contact hole PCo. According to an embodiment, if there is no problem in case that the cathode Cathode2*r* and the cathode connection line CL1 are electrically connected, but the auxiliary connecting member Anode-co may be omitted.

On the anodes Anode2*r* and Anode2*cr* and the auxiliary connecting member Anode-co, a pixel definition layer 380 covering at least part of the anodes Anode2*r* and Anode2*cr* and the auxiliary connecting member Anode-co may be positioned while having openings respectively exposing the anodes Anode2*r* and Anode2*cr* and the auxiliary connecting member Anode-co. The pixel definition layer 380 may be a black pixel definition layer formed of an organic material with a black color so that light applied from the outside is not reflected back to the outside, and according to an embodiment, it may be formed of a transparent organic material.

An auxiliary cathode connection line CLcr and a separator SEP may be positioned on the pixel definition layer 380.

The auxiliary cathode connection line CLcr may be formed of a conductive material, and may electrically connect the cathode Cathode2*r* of the 2-1-th light-emitting element ED2*r* and the additional cathode Cathode2*cr* of the 2-2-th light-emitting element ED2*cr*.

The separator SEP may have the side wall with the reversed taper structure so that the layer positioned on the separator SEP may be electrically disconnected near the separator SEP. As a result, the cathodes Cathode2*r* and Cathode2*cr* may be electrically disconnected based on the separator SEP. The separator SEP and the pixel definition layer 380 may be formed of a same material, or may be formed of different materials through a separate process.

The auxiliary cathode connection line CLcr may have a portion overlapping the separator SEP and electrically connect the cathode Cathode2*r* of the 2-1-th light-emitting element ED2*r* and the additional cathode Cathode2*cr* of the 2-2-th light-emitting element ED2*cr*, which are divided by the separator SEP.

Also, the auxiliary cathode connection line CLcr may be covered by the separator SEP, as shown in FIG. 8, and may be insulated from the cathodes Cathode2*b* and Cathode2*g* of the different colors adjacent thereto.

On the other hand, according to an embodiment, as shown in FIG. 9, the only partial region of the auxiliary cathode connection line CLcr may be covered by the separator SEP, and even in this case, the auxiliary cathode connection line CLcr may not be electrically connected to the cathodes Cathode2*b* and Cathode2*g* of other adjacent colors and may be insulated.

A first functional layer FL-1 may be positioned on the pixel definition layer 380 and the separator SEP, and the first functional layer FL-1 may have the disconnected structure near the separator SEP.

Above the first functional layer FL-1, emission layers EML2*r* and EMLc may be respectively positioned on the anodes Anode2*r* and Anode2*cr* exposed by the openings of the pixel definition layer 380.

A second functional layer FL-2 may be positioned on the first functional layer FL-1 and the emission layers EML2*r* and EMLc, and the second functional layer FL-2 may have a disconnected structure near the separator SEP.

The first functional layer FL-1 and the second functional layer FL-2 may contact each other in the vicinity where the emission layers EML2*r* and EMLc are not positioned.

On the second functional layer FL-2, the cathodes Cathode2*r* and Cathode2*cr* may be positioned, and two cathodes Cathode2*r* and Cathode2*cr* that are separated based on the separator SEP, respectively, may configure the cathode Cathode2*r* of the 2-1-th light-emitting element ED2*r* and the cathode Cathode2*cr* of the 2-2-th light-emitting element ED2*cr*. The cathode Cathode2*r* of the 2-1-th light-emitting element ED2*r* and the additional cathode Cathode2*cr* of the 2-2-th light-emitting element ED2*cr*, which are separated by the separator SEP, may be electrically connected by the auxiliary cathode connection line CLcr.

The combination of the functional layer FL and the emission layer may be referred to as an intermediate layer. The functional layer FL may include at least one of auxiliary layers such as an electron injection layer, an electron transport layer, a hole transport layer, and a hole injection layer. The first functional layer FL-1 positioned under the emission layers EML2*r* and EMLc may include the hole injection layer and/or the hole transport layer. The second functional layer FL-2 positioned on the emission layers EML2*r* and EMLc may include the electron transport layer and/or the electron injection layer.

The 2-1-th light-emitting element ED2*r* may include the anode Anode2*r*, the emission layer EML2*r*, and the cathode Cathode2*r*, and may additionally include the first functional layer FL-1 positioned between the anode Anode2*r* and the emission layer EML2*r*, and the second functional layer FL-2 positioned between the emission layer EML2*r* and the cathode Cathode2*r*.

On the other hand, the 2-2-th light-emitting element ED2*cr* may include the anode Anode2*cr*, the emission layer EMLc, and the cathode Cathode2*cr* and may additionally include the first functional layer FL-1 positioned between the anode Anode2*cr* and the emission layer EMLc and the second functional layer FL-2 positioned between the emission layer EMLc and the cathode Cathode2*cr*.

At least part of the cathode Cathode2*r* of the 2-1-th light-emitting element ED2*r* and the functional layer FL positioned thereunder may overlap the auxiliary connecting member Anode-co and may be electrically connected to the cathode connection line CL1 through the contact hole PCo. In detail, in the embodiment of FIG. 14, the cathode connection line CL1 and the cathode Cathode2*r* of the 2-1-th light-emitting element ED2*r* may be electrically connected by a side contact method. For example, of the triple-layered structure of the cathode connection line CL1, the intermediate layer including aluminum (Al) may be more etched than the lower and upper layers including titanium (Ti), and the cathode Cathode2*r* of the 2-1-th light-emitting element ED2*r* and the intermediate layer of the cathode connection line CL1 may be in contact with each other via the auxiliary connecting member Anode-co disposed therebetween, thereby having a structure in which they are electrically connected. The auxiliary connecting member Anode-co may have a structure connected to the lower layer of the cathode connection line CL1. Since the side contact method of FIG. 14 is one of the electrically connecting methods according to an embodiment, according to an embodiment, they may be electrically connected in various ways.

The cathode connection line CL1 may be electrically connected to the auxiliary cathode connection line CLcr via the cathode Cathode2*r* of the 2-1-th light-emitting element ED2*r*, and may also be electrically connected to the additional cathode Cathode2*cr* of the 2-2-th light-emitting element ED2*cr* by the auxiliary cathode connection line CLcr.

On the other hand, according to an embodiment, a spacer may be further formed on the pixel definition layer 380, and the spacer may have a structure that prevents the cathode from being electrically disconnected by having a tapered side wall.

The structure of the component region DA2-UPC may be different from that of FIGS. 13 and 14, and hereinafter the structure of the embodiment of FIG. 15 is described.

FIG. 15 is a schematic plan view of a light emitting display device according to another embodiment.

In the embodiment of FIG. 15, unlike FIG. 13, the total number of the 2-1-th light-emitting elements ED2*r*, ED2*g*, and ED2*b* and the total number of the 2-2-th light-emitting elements ED2*cr*, ED2*cg*, and ED2*cb* formed in the component region DA2-UPC may be different. For example, in the embodiment of FIG. 13, a 2-2-th light-emitting element ED2*cr*, ED2*cg*, ED2*cb* may be formed for each 2-1-th light-emitting element ED2*r*, ED2*g*, ED2*b* so that the total number of the 2-1-th light-emitting elements ED2*r*, ED2*g*, and ED2*b* and the total number of the 2-2-th light-emitting elements ED2*cr*, ED2*cg*, and ED2*cb* are the same. However, in the embodiment of FIG. 15, two green 2-2-th light-emitting elements ED2*cg* may be electrically connected to the second main light-emitting element ED2*g* of green so that the total number of the 2-2-th light-emitting elements ED2*cr*, ED2*cg*, and ED2*cb* is larger than the total number of the 2-1-th light-emitting elements ED2*r*, ED2*g*, and ED2*b*. The number of second pixel driving parts may be equal to the number of 2-1-th light-emitting elements ED2*r*, ED2*g*, and ED2*b*.

In FIG. 15, an arrow simply illustrates a structure in which the cathodes of the light-emitting elements are electrically connected to each other, and FIG. 15 does not illustrate a separator separating the cathodes.

In the component region DA2-UPC of FIG. 15, a lower shielding layer UPC-BML defining the light transmission region TA-UPC and formed of a metal may be positioned, and a second light-emitting element ED2 and a pixel driving part (not shown) may be positioned on the lower shielding layer UPC-BML.

The 2-1-th light-emitting element ED2m and the 2-2-th light-emitting element ED2c may include a second main unit light-emitting element PXU (hereinafter referred to as a main unit light-emitting element) and additional unit light-emitting elements CPXU1 and CPXU2, the second main unit light-emitting element PXU may include a 2-1-th light-emitting element ED2m of red, green, and blue, and the additional unit light-emitting elements CPXU1 and CPXU2 may include 2-2-th light-emitting elements ED2c of at least two colors among red, green, and blue. Also, the second main unit light-emitting element PXU and the additional unit light-emitting elements CPXU1 and CPXU2 may be positioned on the lower shielding layer UPC-BML. Specifically, the component region DA2-UPC may include the second main unit light-emitting elements PXU composed only of 2-1-th light-emitting elements ED2m of red, green, and blue, and may include the additional unit light-emitting elements CPXU1 and CPXU2 including only the 2-2-th light-emitting elements ED2c of at least two colors among red, green, and blue. The 2-1-th additional unit light-emitting element CPXU1 (hereinafter referred to as a first additional unit light-emitting element) may include only the second 2-2-th light-emitting element ED2cg of green and the second 2-2-th light-emitting element ED2cb of blue, and the 2-2-th additional unit light-emitting element CPXU2 (hereinafter referred to as an additional unit light-emitting element) may include only the second 2-2-th light-emitting element ED2cg of green and the second 2-2-th light-emitting element ED2cr of red. The pixel driving part may be positioned under the second main unit light-emitting element PXU.

According to the structure similar to that of FIG. 15, the camera positioned on the rear surface of the component region DA2-UPC may not only capture the front surface of the light emitting display device through the light transmission region TA-UPC, but also may display the image through the second main unit light-emitting element PXU and the additional unit light-emitting elements CPXU1 and CPXU2, which are positioned on the component region DA2-UPC, thereby widening the display area. Also, by including the additional unit light-emitting elements CPXU1 and CPXU2, the resolution of the displayed image of the component region DA2-UPC may also be improved.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A light emitting display device comprising:
a first display area; and
a second display area adjacent to the first display area, wherein
the second display area includes:
  a pixel driving part;
  a main light-emitting element directly connected to the pixel driving part; and
  an additional light-emitting element connected to the main light-emitting element,
the additional light-emitting element overlaps a peripheral driving part in a plan view,
the peripheral driving part generates a signal provided to the pixel driving part,
the main light-emitting element and the additional light-emitting element each include a first electrode, an emission layer, and a second electrode,
the pixel driving part is electrically connected to the second electrode of the main light-emitting element and the second electrode of the additional light-emitting element, and
the second electrode of the additional light-emitting element and the second electrode of the main light-emitting element are separated by a separator.

2. The light emitting display device of claim 1, further comprising:
an auxiliary cathode connection line electrically connecting the second electrode of the additional light-emitting element and the second electrode of the main light-emitting element,
wherein at least part of the auxiliary cathode connection line is covered by the separator.

3. The light emitting display device of claim 2, wherein the first electrode of the main light-emitting element and the first electrode of the additional light-emitting element are electrically connected to a first driving voltage line.

4. The light emitting display device of claim 3, wherein the auxiliary cathode connection line is insulated from the second electrode included in a light-emitting element displaying different colors.

5. The light emitting display device of claim 4, further comprising:
a cathode connection line electrically connecting the second electrode of the main light-emitting element and the pixel driving part, wherein
the cathode connection line has a triple layer structure, and
the second electrode of the main light-emitting element and the cathode connection line are in side-contact.

6. The light emitting display device of claim 5, further comprising:
an auxiliary connecting member disposed in the side-contact between the second electrode of the main light-emitting element and the cathode connection line,
wherein the auxiliary connecting member, the first electrode of the main light-emitting element, and the first electrode of the additional light-emitting element include a same material.

7. A light emitting display device comprising:
a first display area; and
a second display area adjacent to the first display area and including a light transmission region, wherein the second display area includes:
a pixel driving part;
a main light-emitting element electrically connected to the pixel driving part; and
an additional light-emitting element,
the main light-emitting element and the additional light-emitting element each include a first electrode, an emission layer, and a second electrode,
the pixel driving part is electrically connected to the second electrode of the main light-emitting element and the second electrode of the additional light-emitting element, and
the second electrode of the additional light-emitting element and the second electrode of the main light-emitting element are separated by a separator.

8. The light emitting display device of claim 7, further comprising:
an auxiliary cathode connection line electrically connecting the second electrode of the additional light-emitting element and the second electrode of the main light-emitting element,
wherein at least part of the auxiliary cathode connection line is covered by the separator.

9. The light emitting display device of claim 8, wherein the first electrode of the main light-emitting element and the first electrode of the additional light-emitting element are electrically connected to a first driving voltage line.

10. The light emitting display device of claim 9, wherein the auxiliary cathode connection line is insulated from the second electrode included in a light-emitting element displaying a different color.

11. The light emitting display device of claim 10, further comprising:
a cathode connection line electrically connecting the second electrode of the main light-emitting element and the pixel driving part, wherein
the cathode connection line has a triple layer structure, and
the second electrode of the main light-emitting element and the cathode connection line are in side contact.

12. The light emitting display device of claim 11, further comprising:
an auxiliary connecting member disposed on the side contact between the second electrode of the main light-emitting element and the cathode connection line,
wherein the auxiliary connecting member, the first electrode of the main light-emitting element, and the first electrode of the additional light-emitting element include a same material.

13. A light emitting display device comprising:
a transistor disposed on a substrate;
a planarization layer covering the transistor;
a first electrode and an additional first electrode disposed on the planarization layer;
a pixel definition layer having openings each exposing at least part of the first electrode and the additional first electrode;

an auxiliary cathode connection line disposed on the pixel definition layer;
a separator overlapping at least part of the auxiliary cathode connection line in a plan view and having a reversed tapered side wall; and
a second electrode and an additional second electrode disposed on the pixel definition layer and divided by the separator,
wherein the second electrode and the additional second electrode are electrically connected by the auxiliary cathode connection line.

14. The light emitting display device of claim 13, wherein at least part of the auxiliary cathode connection line is covered by the separator.

15. The light emitting display device of claim 14, wherein the auxiliary cathode connection line is insulated from the second electrode included in a light-emitting element displaying a different color.

16. The light emitting display device of claim 15, wherein the first electrode and the additional first electrode are electrically connected to a first driving voltage line.

17. The light emitting display device of claim 16, further comprising:
a cathode connection line electrically connecting the second electrode and the transistor, wherein
the cathode connection line has a triple layer structure, and
the second electrode and the cathode connection line are in side contact.

18. The light emitting display device of claim 17, further comprising:
an auxiliary connecting member disposed on the side contact between the second electrode and the cathode connection line,
wherein the auxiliary connecting member, the first electrode, and the additional first electrode include a same material.

19. The light emitting display device of claim 16, wherein
the additional first electrode and the additional second electrode are included in an additional light-emitting element,
the additional light-emitting element overlaps a peripheral driving part in a plan view, and
the peripheral driving part generates a signal that is provided to a pixel driving part that includes the transistor.

20. The light emitting display device of claim 16, wherein
the transistor, the first electrode, the additional first electrode, the second electrode, the additional second electrode, and the auxiliary cathode connection line are disposed in a second display area, and
the second display area includes a light transmission region.

*    *    *    *    *